(12) United States Patent
Matsubara et al.

(10) Patent No.: US 8,217,279 B2
(45) Date of Patent: Jul. 10, 2012

(54) CERAMIC ELECTRONIC COMPONENT AND METHOD FOR MANUFACTURING THE SAME

(75) Inventors: Daigo Matsubara, Yasu (JP); Osamu Chikagawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 361 days.

(21) Appl. No.: 11/971,928

(22) Filed: Jan. 10, 2008

(65) Prior Publication Data
US 2008/0164053 A1 Jul. 10, 2008

Related U.S. Application Data

(63) Continuation of application No. PCT/JP2006/311803, filed on Jun. 13, 2006.

(30) Foreign Application Priority Data

Aug. 29, 2005 (JP) .................... 2005-248254

(51) Int. Cl.
*H05K 1/11* (2006.01)
(52) U.S. Cl. ...... 174/264; 174/254; 361/309; 361/321.1; 361/763; 361/311
(58) Field of Classification Search .................. 361/309, 361/321.1, 763, 311; 174/264, 254
See application file for complete search history.

(56) References Cited

U.S. PATENT DOCUMENTS

| | | | | |
|---|---|---|---|---|
| 5,408,053 A | * | 4/1995 | Young ........................... | 174/264 |
| 5,468,995 A | | 11/1995 | Higgins, III | |
| 6,414,247 B1 | * | 7/2002 | Nakai et al. ................... | 174/257 |
| 6,542,352 B1 | * | 4/2003 | Devoe et al. ............... | 361/321.2 |
| 6,885,539 B1 | * | 4/2005 | Devoe et al. .................. | 361/303 |
| 7,035,080 B1 | | 4/2006 | Davoe et al. | |
| 2005/0057887 A1 | * | 3/2005 | Devoe et al. .................. | 361/311 |

FOREIGN PATENT DOCUMENTS

| | | |
|---|---|---|
| EP | 1 471 574 A2 | 10/2004 |
| JP | 02-158194 A | 6/1990 |
| JP | 03-225897 A | 10/1991 |
| JP | 2004-356527 A | 12/2004 |
| JP | 2005-183890 A | 7/2005 |

OTHER PUBLICATIONS

Official communication issued in the International Application No. PCT/JP2006/311803, mailed on Jul. 11, 2006.
Official communication issued in counterpart Korean Application No. 10-2007-7029070, mailed on Mar. 19, 2009.
Official communication issued in counterpart Chinese Application No. 2006800242856, mailed on Mar. 27, 2009.
Official Communication issued in corresponding European Patent Application No. 06766615.6, mailed on Aug. 21, 2009.

* cited by examiner

*Primary Examiner* — Tuan T Dinh
*Assistant Examiner* — Steven Sawyer
(74) *Attorney, Agent, or Firm* — Keating & Bennett, LLP

(57) ABSTRACT

A ceramic electronic component achieves a sufficient drop resistance strength even when terminal electrodes are formed with a higher density. The ceramic electronic component includes a ceramic laminate including ceramic laminates which are laminated to each other, first terminal electrodes disposed in a peripheral portion of a bottom surface of the ceramic laminate, catch pad electrodes arranged in the ceramic laminate so as to face the respective first terminal electrodes, and sets each including at least two first via hole conductors, which electrically connect the first terminal electrodes and the respective catch pad electrodes.

17 Claims, 12 Drawing Sheets

CERAMIC ELECTRONIC COMPONENT AND METHOD FOR MANUFACTURING THE SAME

BACKGROUND OF THE INVENTION

1. Field of the Invention

The present invention relates to ceramic electronic components and methods for manufacturing the same, and more particularly, the present invention relates to a ceramic electronic component having terminal electrodes to be connected to a mother board, and even more specifically, the present invention relates to a ceramic electronic component having terminal electrodes disposed with a high density and being able to improve a bonding strength between the terminal electrodes and a ceramic member and a method for manufacturing the same.

2. Description of the Related Art

There have been many techniques to improve a bonding strength between a ceramic member and a terminal electrode. For example, in Japanese Unexamined Patent Application Publication No. 2-158194, a technique has been disclosed in which a plurality of dummy via holes is formed for a land (terminal electrode) so as to improve a bonding strength between the land and a ceramic substrate. In addition, in Japanese Unexamined Patent Application Publication No. 3-225897, a technique has been disclosed in which by forming a pad (terminal electrode) at a position different from that of a via hole conductor, peeling of the pad caused by protrusion of the via hole conductor is suppressed to improve a bonding strength between the pad and a ceramic substrate.

However, according to the technique of Japanese Unexamined Patent Application Publication No. 2-158194, although one end of the dummy via hole is connected to the corresponding land, the other end is not connected to anything, and hence the dummy via hole is not sufficient to improve the bonding strength. In addition, according to the technique of Japanese Unexamined Patent Application Publication No. 3-225897, since the positions of the pads are limited, the terminal electrodes cannot be disposed with a high density. In recent years, as ceramic electronic components mounted on mobile terminals have been developed in terms of an increase in the number of functions and an improvement in the performance, the terminal electrodes are increasingly required to be disposed with a higher density, and in addition, an improvement in mechanical strength, in particular, drop resistance strength, also tends to be increasingly required. However, in spite of the trend as described above, the improvement in bonding strength between the terminal electrode and the ceramic member by the techniques disclosed in the above-identified prior art references has been limited.

SUMMARY OF THE INVENTION

In order to solve the problems described above, preferred embodiments of the present invention provide a ceramic electronic component which can realize a sufficient drop resistance strength even when terminal electrodes are disposed at a higher density and a method for manufacturing the ceramic electronic component.

A ceramic electronic component according to a preferred embodiment of the present invention includes: a ceramic laminate including ceramic layers laminated to each other; at least one terminal electrode provided on a first primary surface of the ceramic laminate; at least one catch pad electrode arranged in the ceramic laminate so as to face the terminal electrode; and at least one set each including at least two first via hole conductors which electrically connect the terminal electrode and the catch pad electrode.

It is preferable that the terminal electrodes be disposed in a peripheral portion of the first primary surface of the ceramic laminate, and that the catch pad electrodes be arranged so as to face the respective terminal electrodes.

It is also preferable that the ceramic laminate be formed by a non-shrinkage process, and that the terminal electrode, the catch pad electrode, and the first via hole conductors be formed from a conductive material primarily composed of Ag.

The terminal electrode and the catch pad electrode more preferably have parts which are not overlapped with each other when the terminal electrode is viewed from a catch pad electrode side.

The area of the catch pad electrode is more preferably larger than the area of the terminal electrode.

The terminal electrode is more preferably a stud electrode in the form of a pillar protruding from the first primary surface.

Among the sets each including first via hole conductors for the terminal electrodes, a virtual line connecting two first via hole conductors for one terminal electrode is more preferably arranged so as not to be the same as a virtual line connecting two first via hole conductors of another terminal electrode adjacent to the one terminal electrode.

The virtual line connecting the two first via hole conductors is more preferably arranged so as to pass approximately the center of the first primary surface.

The terminal electrode, the first via hole conductors, and the catch pad electrode are more preferably integrated by simultaneous firing.

In addition, according to another preferred embodiment of the present invention, a method for manufacturing a ceramic electronic component which includes a ceramic laminate composed of ceramic layers laminated to each other, at least one terminal electrode provided on a first primary surface of the ceramic laminate, at least one catch pad electrode arranged in the ceramic laminate so as to face the terminal electrode, and at least one set each including at least two first via hole conductors which electrically connect the terminal electrode and the catch pad electrode, includes the steps of: providing restriction ceramic green layers on a first primary surface and a second primary surface of a green ceramic laminate to form a green composite laminate, the green ceramic laminate being formed of ceramic green layers laminated to each other and being to be formed into the ceramic laminate, the restriction ceramic green layers being not substantially sintered at a sintering temperature of the ceramic green layers; firing the green composite laminate at the sintering temperature of the ceramic green layers; and removing the restriction ceramic green layers from the sintered ceramic laminate.

In addition, the method for manufacturing a ceramic electronic component, according to a preferred embodiment of the present invention, preferably further includes the step of forming at least one via hole conductor in at least one of the restriction ceramic green layers using a conductive material which is sintered at the sintering temperature of the ceramic green layers, whereby when the restriction ceramic green layers are removed after the firing step, at least one stud electrode in the form of a pillar protruding from the first primary surface is formed.

Accordingly, preferred embodiments of the present invention provide a ceramic electronic component which can realize a sufficient drop resistance strength even when terminal electrodes are formed with a higher density and a method for manufacturing the ceramic electronic component.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, the present invention will be described with reference to preferred embodiments shown in FIGS. 1A to 13B.

First Preferred Embodiment

Figure 1A:
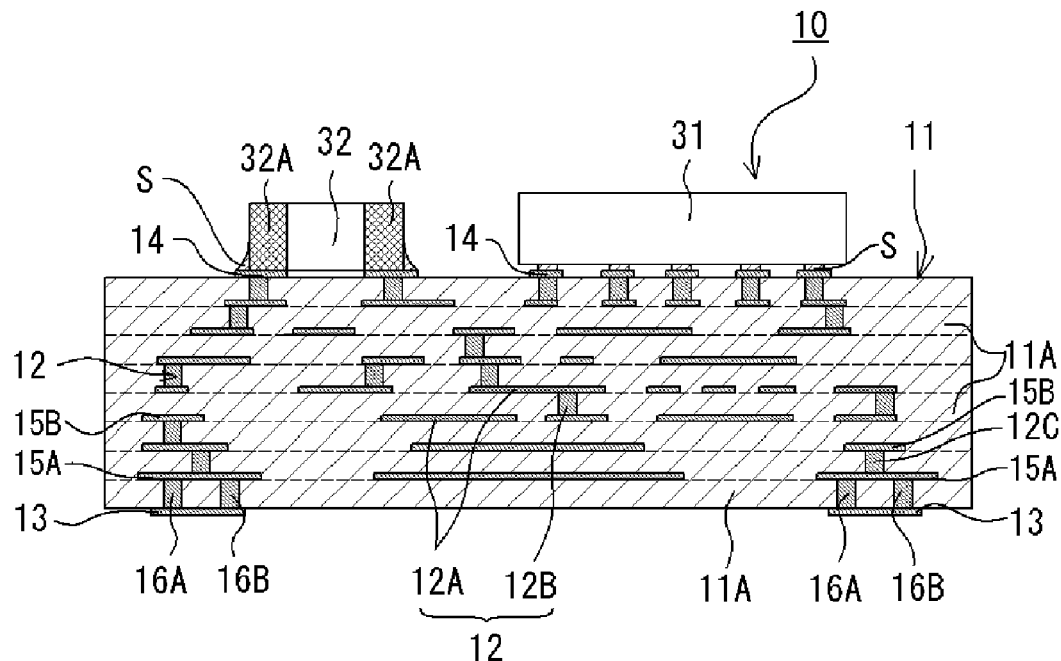
FIGS. 1A to 1C are views showing a preferred embodiment of a ceramic electronic component according to the present invention, FIG. 1A being a cross-sectional view thereof, 1B being a perspective view showing a surface to be bonded to a mounting substrate, which is placed at an upper side in the figure, and 1C being a cross-sectional view of an important portion.
Figure 1B:
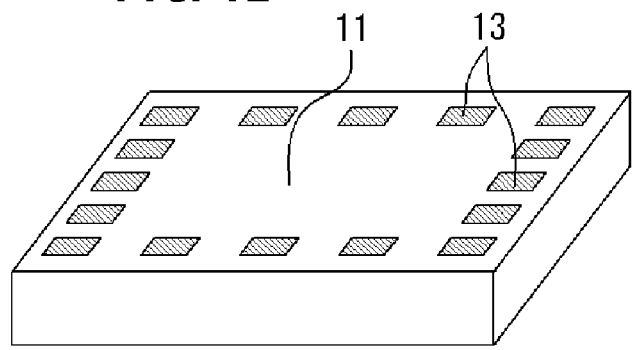
Figure 1C:
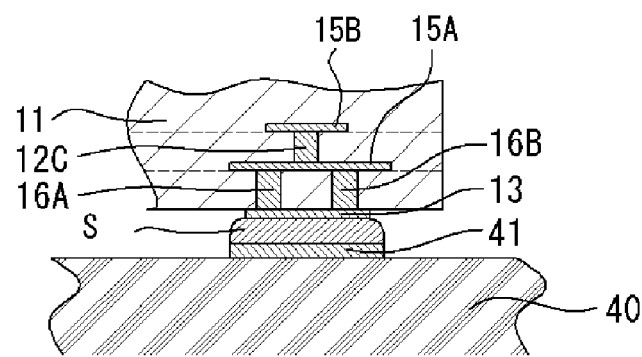

A ceramic electronic component 10 of this preferred embodiment has, for example, as shown in FIGS. 1A to 1C, a ceramic laminate 11 which includes ceramic layers 11A laminated to each other and which has a first primary surface (bottom surface) and a second primary surface (top surface); a wire pattern 12 provided in the ceramic laminate 11; first terminal electrodes 13 electrically connected to the wire pattern 12 and formed on the bottom surface of the ceramic laminate 11 to have a predetermined pattern; and second terminal electrodes 14 electrically connected to the wire pattern 12 and disposed on the top surface of the ceramic laminate 11 to have a predetermined pattern. In addition, the ceramic electronic component 10 is formed so that first and second surface mount components 31 and 32 mounted on the top surface of the ceramic laminate 11 are electrically connected to a mounting substrate 40 such as a mother board. The first surface mount component 31 is an active element, such as a silicon semiconductor element or a GaAs compound semiconductor element, and the second surface mount component 32 is a passive element such as a capacitor or an inductor.

The wire pattern 12 includes, as shown in FIG. 1A, in-plane conductors (hereinafter referred to as "line conductors") 12A arranged along interfaces between the ceramic layers 11A laminated to each other so as to have a predetermined pattern and via hole conductors 12B penetrating predetermined ceramic layers 11A to have a predetermined pattern so as to electrically connect between the line conductors 12A located in the top and down direction.

The first terminal electrodes 13 are, as shown in FIG. 1B, are disposed along a peripheral portion of the bottom surface of the ceramic laminate 11 with predetermined intervals and are designed to be electrically connected to terminal electrodes 41 formed on a top surface of the mounting substrate 40 (see FIG. 1C), such as a mother board, mounting the ceramic electronic component 10 with bonding members S, such as solder, interposed therebetween. The second terminal electrodes 14 are disposed on the top surface of the ceramic laminate 11 to have a predetermined pattern and are designed to be electrically connected to external terminal electrodes 31A (however, the external electrodes of the first surface mount component are not shown in the figure) of the respective first and second surface mount components 31 and 32 mounted on the top surface of the ceramic laminate 11 with bonding members S interposed therebetween.

In addition, as shown in FIG. 1A, inside the ceramic laminate 11, catch pad electrodes 15A are arranged so as to face the respective first terminal electrodes 13, and the catch pad electrodes 15A and the respective first terminal electrodes 13 are arranged to define pairs with a lowermost ceramic layer 11A interposed therebetween. The first terminal electrode 13 and the catch pad electrode 15A are electrically connected to each other by two first via hole conductors 16A and 16B penetrating the lowermost ceramic layer 11A. In this preferred embodiment, the case in which the two first via hole conductors 16A and 16B are provided is described. However, at least three first via hole conductors may also be provided.

The first terminal electrode 13, the catch pad electrode 15A, and the two first via hole conductors 16A and 16B are all integrally formed using a conductive material as shown in FIGS. 1A and 1C so as to function as an electrode electrically connected to the wire pattern 12. Since the catch pad electrode 15A is integrated with the first terminal electrode 13 with the two first via hole conductors 16A and 16B interposed therebetween, an anchor effect is imparted to the first terminal electrode 13 bonded to the bottom surface of the ceramic laminate 11, so that the first terminal electrode 13 is tightly bonded to the ceramic laminate 11. In order to increase the anchor effect, the first catch pad electrode 15A is preferably formed to have an area larger than that of the first terminal electrode 13 as shown in the above figures. In addition, by providing the two first via hole conductors 16A and 16B, the bonding area (contact area) of the ceramic laminate 11 with the first via hole conductors 16A and 16B and the first terminal electrode 13 can be increased, and as a result, the bonding strength between the first terminal electrode 13 and the ceramic laminate 11 can be increased. The cross-sections of the first via hole conductors 16A and 16B in the horizontal direction may be a substantially circular shape or a polygonal shape.

When the mounting substrate 40 mounting the ceramic electronic component 10 falls, and an impact force is applied thereto, it is believed that a tensile force, a compressive force, and a shear stress collectively work on the ceramic electronic component 10 from the mounting substrate 40 via the first terminal electrodes 13. Against the tensile force, by the anchor effect of the catch pad electrode 15A and the first via hole conductors 16A and 16B, the bonding strength of the first terminal electrode 13 can be significantly improved. Against the compressive force, since a soft conductive material having superior elasticity is used for the first terminal electrode 13, the first via hole conductors 16A and 16B, and the catch pad electrode 15A as compared to that for the ceramic layer 11A, by its elastic effect, the impact or the like is absorbed and reduced, so that the drop resistance strength can be improved. In addition, against the shear stress, by the presence of at least two first via hole conductors 16A and 16B, the shear stress can be dispersed and reduced, and as a result, the drop resistance strength can be significantly improved. Since the bonding strength between the first terminal electrode 13 and the ceramic laminate 11 can be significantly improved as described above, as a conductive paste, for example, a paste substantially containing no glass component and having a high content of a conductive metal component, such as a paste including an inorganic material composed of about 98 percent by weight of a conductive metal component, may also be used. As a result, an electrode having superior solder wettability and high conductivity can be formed.

Figure 2A:
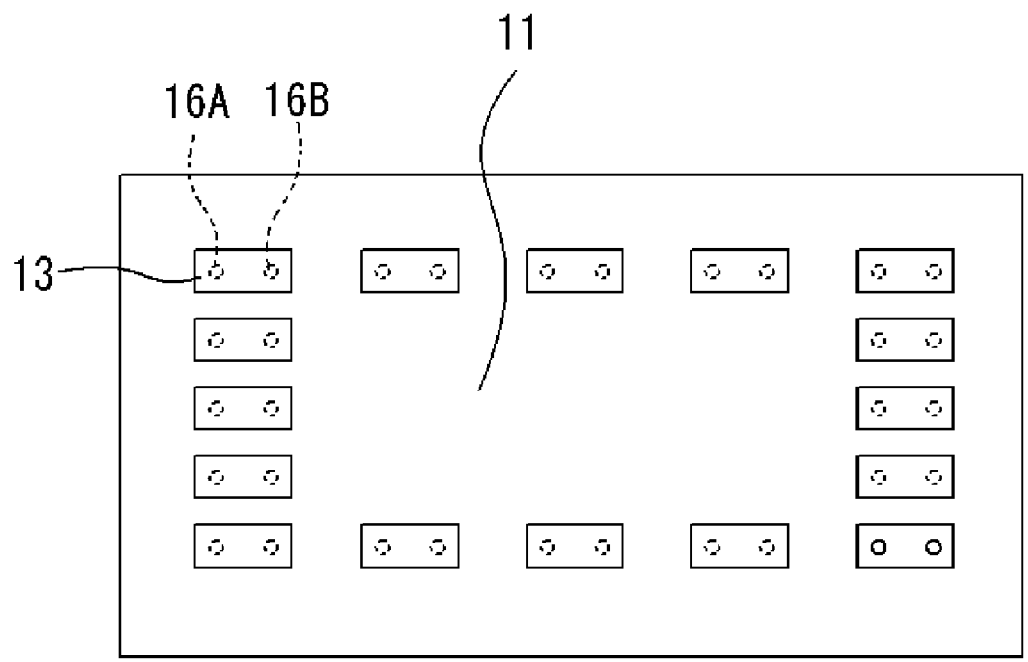
FIGS. 2A and 2B are each a plan view showing an arrangement state of first via hole conductors of a ceramic electronic component according to a preferred embodiment of the present invention, FIG. 2A being a view showing the ceramic electronic component shown in FIGS. 1A-1C, and 2B being a view showing another preferred embodiment of the ceramic electronic component according to the present invention.

The first terminal electrodes 13 are each formed to have an approximately rectangular shape as shown in FIG. 1B and are arranged in the same direction along the peripheral portion of the bottom surface of the ceramic laminate 11 to form a line. As shown in FIG. 2A, for example, the two first via hole conductors 16A and 16B are separately disposed along the longitudinal direction of the first terminal electrode 13 with a predetermined distance from the center thereof. In FIG. 2A, when the two first via hole conductors 16A and 16B for one first terminal electrode 13 are connected by a straight line, other first via hole conductors 16A and 16B adjacent to the above conductors 16A and 16B are also disposed on substantially the same straight line as described above. On the other hand, in order to further improve the drop resistance strength, the two first via hole conductors 16A and 16B of the first terminal electrode 13 and those of other first terminal electrode 13 adjacent thereto are preferably arranged in a zigzag configuration and are not aligned. Since the two first via hole conductors 16A and 16B and the adjacent two first via hole conductors 16A and 16B are arranged in the zigzag configuration, the tensile force and the shear stress applied to each first terminal electrode 13 can be more effectively dispersed, and the impact resistance in falling can be improved, thereby more reliably preventing the separation of the ceramic electronic component 10 from the mounting substrate 40. In particular, as shown in FIG. 2B, the two first via hole conductors 16A and 16B for each first terminal electrodes 13 are preferably arranged such that the straight line between the first via hole conductors 16A and 16B is radially disposed to pass approximately the center of the ceramic laminate 11.

Figure 2B:
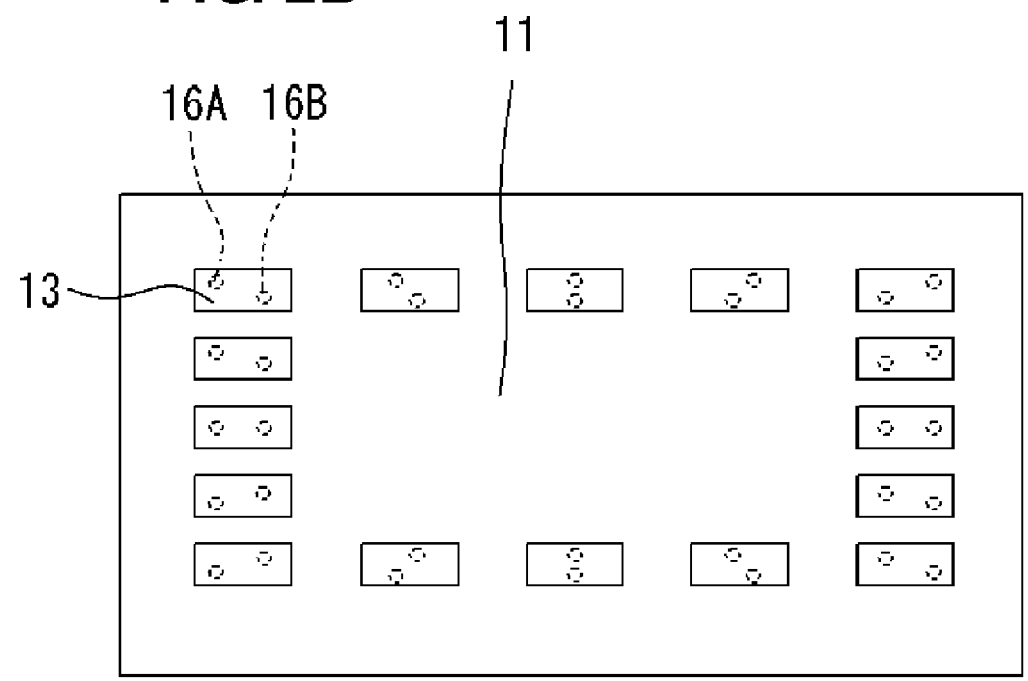
Figure 3A:
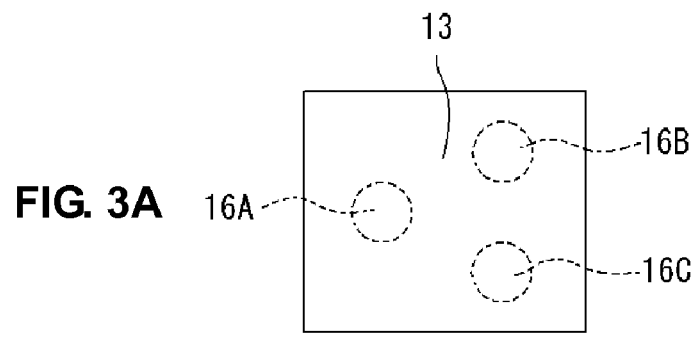
FIGS. 3A to 3D are plan views each showing the relationship of a first terminal electrode, first via hole conductors, and a catch pad electrode of another preferred embodiment of the ceramic electronic component according to the present invention.
Figure 3B:
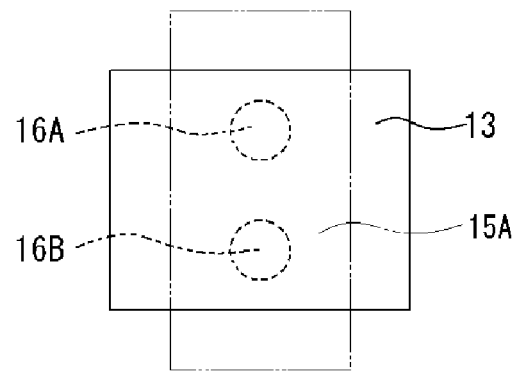

In addition, in FIGS. 2A and 2B, although the two first via hole conductors 16A and 16B are shown by way of example, in accordance with the area of the first terminal electrode 13, as shown in FIG. 3A, at least three first via hole conductors may be provided. In particular, when at least three first via hole conductors 16A, 16B, and 16C are arranged so as not to be aligned, for example, a side-slip prevention effect and an anchor effect to the first terminal electrode 13 can be improved, and as a result, the drop resistance strength of the ceramic electronic component 10 can be improved. In addition, as shown in FIGS. 3A to 3D, when the first terminal electrode 13 and the catch pad electrode 15A are viewed from the upper side and the lower side thereof, respectively, they preferably have parts which are not overlapped with each other. When the parts which are not overlapped with each other are provided, the anchor effect can be further improved.

Figure 3C:
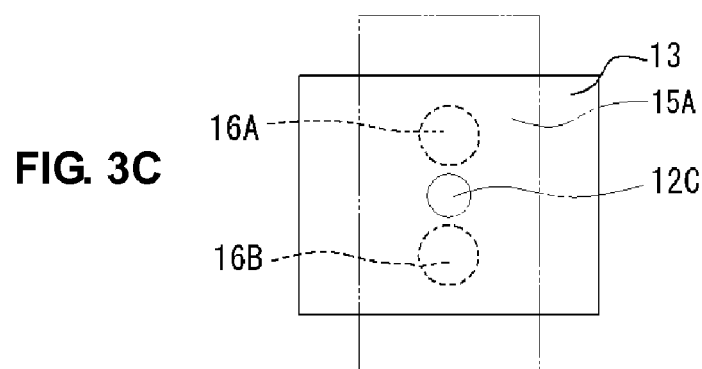
Figure 3D:
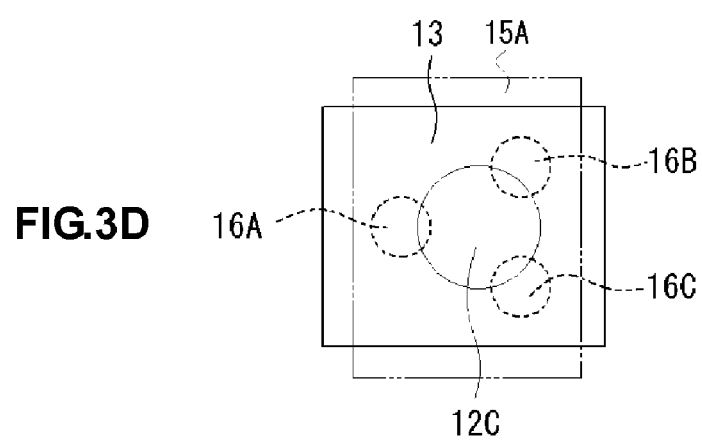

As shown in FIGS. 1A and 1C, and FIG. 3C, the catch pad electrode 15A is also connected to another catch pad electrode 15B, which is electrically connected to the wire pattern 12, via a second via hole conductor 12C provided on the catch pad electrode 15A. The center of the second via hole conductor 12C connecting the catch pad electrode 15A and the catch pad electrode 15B is disposed between the first via hole conductors 16A and 16B so as not to be overlapped with the center of the first via hole conductor 16A or 16B. Since the second via hole conductor 12C is disposed between the first via hole conductors 16A and 16B, a tensile strength from the first terminal electrode 13 is not directly transmitted to the second via hole conductor 12C and is dispersed by the catch pad electrode 15A, and as a result, wire breakage between the second via hole conductor 12C and the catch pad electrode 15A can be reliably prevented. In addition, even when each via hole conductor protrudes or recedes in firing, defects, such as wire breakage and/or crack generation, are not likely to occur. In addition, when the second via hole conductor 12C is formed thick as shown in FIG. 3D and is disposed so as to be laid across the three first via hole conductors 16A, 16B, and 16C, the bonding strength between the catch pad electrode 15A and the second via hole conductor 12C can be further increased. In addition, the catch pad electrode 15A and the catch pad electrode 15B more preferably have parts which are not overlapped with each other in order to further improve the drop resistance strength.

In addition, as a ceramic material forming the ceramic layers of this preferred embodiment, for example, a low temperature co-fired ceramic (LTCC) material may be used. The low temperature co-fired ceramic is a ceramic material which can be sintered at a temperature of about 1,050° C. or less and which can be simultaneously sintered with silver, copper, or the like having a relatively small specific resistance. In particular, as the low temperature co-fired ceramic material, for example, glass composite-based LTCC materials formed of a ceramic powder, such as alumina, zirconia, magnesia, or forsterite, mixed with borosilicate glass; crystallized glass-based LTCC materials using a ZnO—MgO—$Al_2O_3$—$SiO_2$-based crystallized glass; and non-glass-based LTCC materials using a BaO—$Al_2O_3$—$SiO_2$-based ceramic powder, or an $Al_2O_3$—CaO—$SiO_2$—MgO—$B_2O_3$-based ceramic powder, may be used.

With the use of the low temperature co-fired ceramic material as a material for the ceramic layer 11A, a metal having a low resistance and a low melting point, such as Ag or Cu, can be used as a wire material, and the ceramic laminate 11 and the wire pattern 12 (including the first and the second terminal electrodes, the catch pad electrodes, and the first via hole conductors) can be simultaneously fired at a low temperature of about 1,050° C. or less. In particular, since the Young's modulus (7.32×1010 Pa) of Ag is smaller than the Young's modulus (1.23×1011 Pa) of Cu, Ag effectively reduces a compressive stress as compared to that of Cu, and hence, compared to Cu, Ag can be preferably used in order to improve the drop resistance strength.

In addition, as the ceramic material, a high temperature co-fired ceramic (HTCC) material may also be used. As the high temperature co-fired ceramic material, for example, materials which are formed by adding a sintering auxiliary agent, such as glass, to alumina, aluminum nitride, mullite, or the like, followed by sintering at about 1,100° C. or more, may be used. In this case, as the wire pattern 12, a metal selected from Mo, Pt, Pd, W, Ni, and an alloy thereof is preferably used.

Next, with reference to FIGS. 4 and 5, a preferred embodiment of a method for manufacturing the ceramic electronic component according to the present invention will be described. In this preferred embodiment, a case in which the ceramic laminate 11 is manufactured by a non-shrinkage process will be described. The non-shrinkage process indicates a process in which the dimension in the plane direction of the ceramic laminate 11 is not substantially changed before and after firing thereof.

In order to form the ceramic laminate 11, after a slurry is first prepared by dispersing a low temperature co-fired ceramic material (such as a ceramic material containing $Al_2O_3$ as filler and, as a sintering auxiliary agent, borosilicate glass using an alkaline earth metal oxide as a modified oxide) in a binder such as vinyl alcohol, this slurry is applied on a carrier film (not shown) by a doctor blade method or the like, thereby forming a ceramic green sheets for low temperature sintering. Subsequently, the ceramic green sheet is cut into a predetermined size.

Figure 4A:
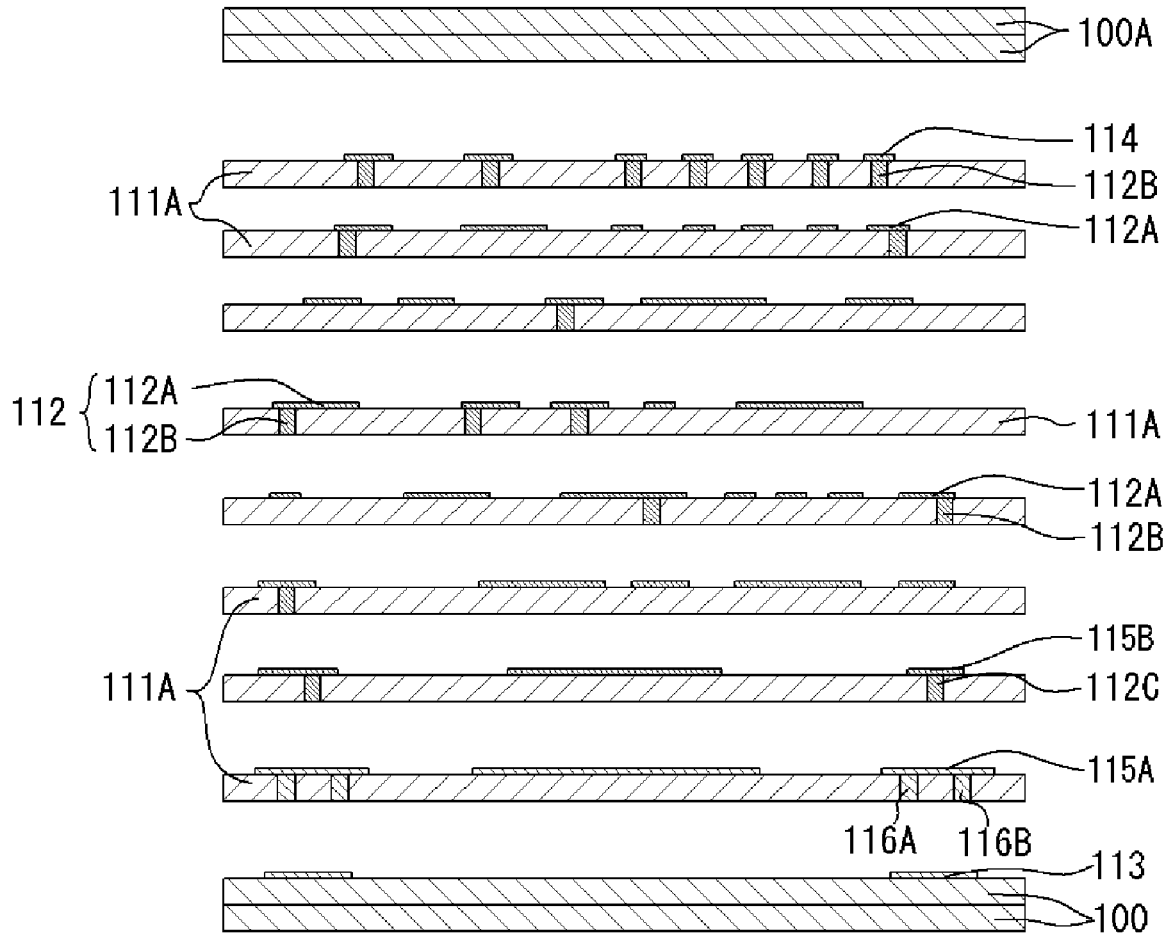
FIGS. 4A and 4B are views each showing a step of manufacturing the ceramic electronic component shown in FIGS. 1A-1C, FIG. 4A being a cross-sectional view showing the order of lamination of ceramic green sheets and restriction ceramic green sheets, and FIG. 4B being a cross-sectional view of a green composite laminate.
Figure 4B:
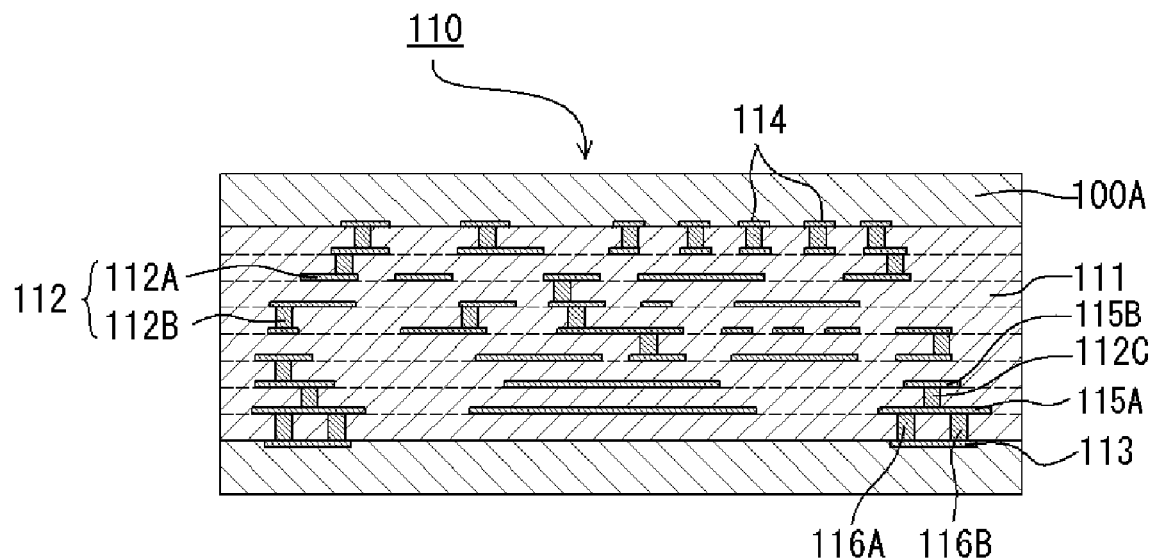

Next, as shown in FIG. 4A, a plurality of holes for the first via hole conductors is formed to have a predetermined pattern in a bottommost ceramic green sheet 111A by a mold or laser light, and in addition, holes for via hole conductors forming a wire pattern are formed to have a predetermined pattern in other predetermined ceramic green sheets 111A. Subsequently, a conductive paste prepared by mixing a metal powder primarily composed of, for example, Ag or Cu, a resin, and an organic solvent is filled in the via hole conductor holes in the predetermined ceramic green sheets 111A except the bottommost ceramic green sheet, followed by drying, thereby forming via hole conductor portions 112B and second via hole conductor portions 112C. In a manner similar to that described above, the conductive paste is filled in the holes for the first via hole conductors of the bottommost ceramic green sheet 111A, followed by drying, thereby forming first via hole conductor portions 116A and 116B.

Furthermore, a conductive paste similar to that described above is applied to form a predetermined pattern on the bottommost ceramic green sheet 111A by a screen printing method and is then dried to form catch pad electrode portions 115A, and in the manner similar to that described above, a conductive paste is applied to form a predetermined pattern on a topmost ceramic green sheet 111A and is then dried to form second terminal electrode portions 114. In the manner similar to that described above, line conductor portions 112A are formed on the other predetermined ceramic green sheets 111.

Next, restriction ceramic green sheets are formed. The restriction ceramic green sheet primarily contains a sintering resistant ceramic powder which is not sintered at a sintering temperature of a low temperature co-fired ceramic material. As the sintering resistant ceramic powder, for example, an alumina powder is prepared and is then dispersed in an organic vehicle to form a slurry, and this slurry is formed into sheets by a casting method, so that restriction ceramic green sheets 100 and 100A shown in FIG. 4A were prepared, the number of the green sheets 100 and that of the green sheets 100A being, for example, two. Since the sintering temperature of the restriction ceramic green sheets 100 and 100A are about 1,500° C. to about 1,600° C., which is significantly higher than the sintering temperature (about 1,050° C. or less) of the ceramic green sheet 111A composed of the low temperature co-fired ceramic material, the restriction ceramic green sheets 100 and 100A are not substantially sintered at the firing temperature of the ceramic green sheet 111A. As the sintering resistant ceramic powder, for example, besides alumina, a ceramic powder, such as zirconia or magnesia, may also be used. The restriction ceramic green sheets 100 and 100A preferably contain ceramic components which are also contained in the ceramic green sheet 111A. On the top surface of one restriction ceramic green sheet 100, a conductive paste is printed in a predetermined pattern as shown in FIG. 4A to form first terminal electrode portions 113. Incidentally, the restriction ceramic green sheets 100 and 100A are substantially the same.

As shown in FIG. 4A, after the two restriction ceramic green sheets 100 are laminated so that the first terminal electrode portions 113 are disposed at an upper side, the bottommost ceramic green sheet 111A is laminated on the two restriction ceramic green sheets 100 so that sets each containing the via hole conductor portions 116A and 116B are aligned with the respective first terminal electrode portions 113, the ceramic green sheets 111A having the line conductor portions 112A and the via hole conductor portions 112B and 112C are then laminated on the bottommost ceramic green sheet 111A in a predetermined order, and the ceramic green sheet 111A is then laminated as the topmost layer so that the second terminal electrode portions 114 are disposed at an upper side. Next, after the two restriction ceramic green sheets 100A are laminated on the layers laminated as described above, the individual layers are pressure-bonded by pressing in the lamination direction (up and down direction) at a pressure in the range of about 0.2 MPa to about 1.5 MPa so as to be integrated together, and as a result, a green composite laminate 110 shown in FIG. 4B can be formed.

Figure 5A:
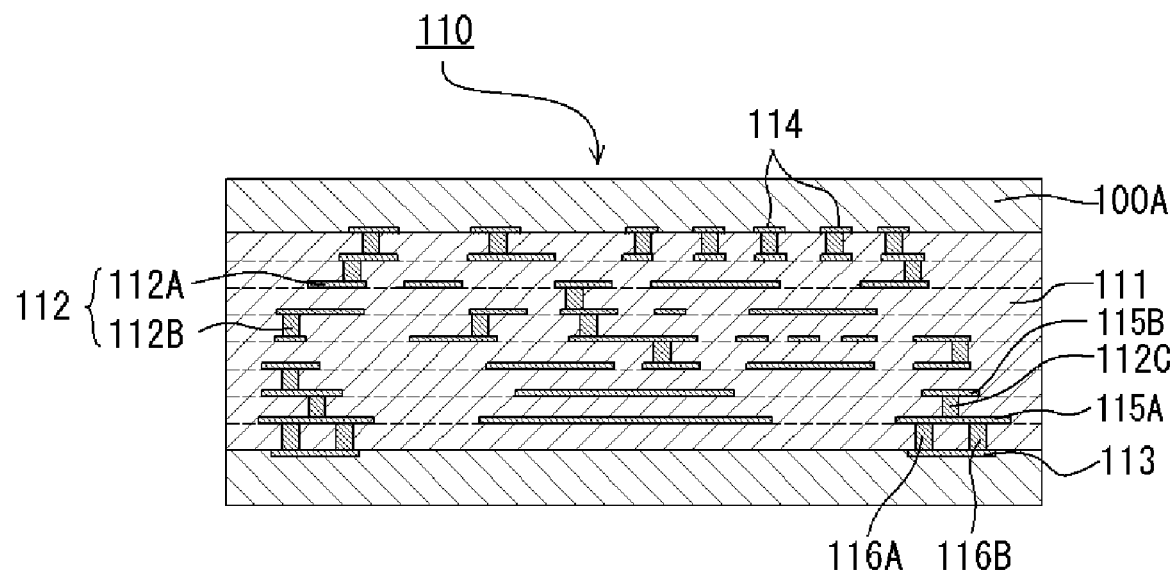
FIGS. 5A and 5B are cross-sectional views showing steps of manufacturing the ceramic electronic component shown in FIGS. 1A-1C before and after firing, respectively.
Figure 5B:
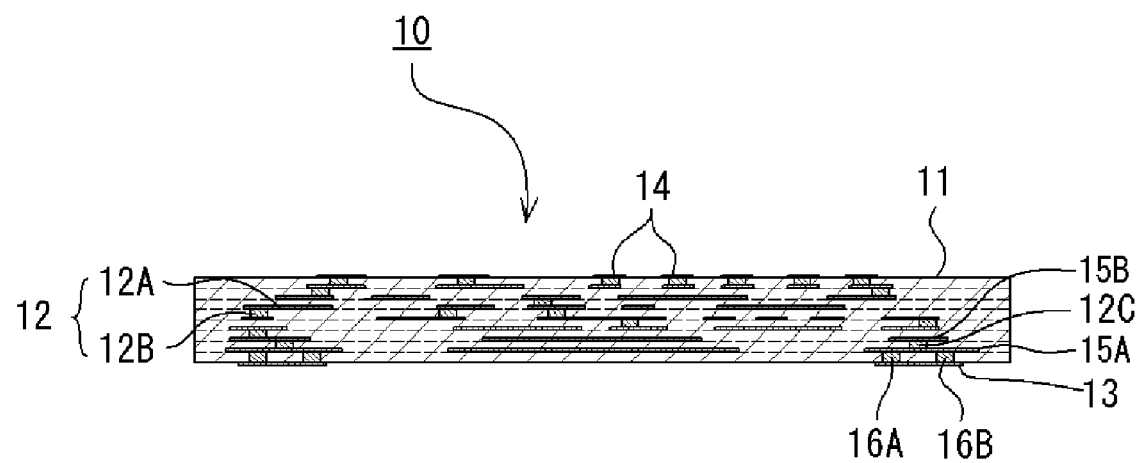

When the green composite laminate 110 shown in FIG. 5A is fired, for example, at a predetermined temperature (such as about 870° C.) of about 1,050° C. or less, although the ceramic green sheets 111A are sintered and integrated together as shown in FIG. 5B, by the function of the restriction ceramic green sheets 100 and 100A, the shrinkage does not substantially occur in the plane direction and does substantially occur only in the lamination direction (thickness direction), thereby forming the ceramic laminate 11 shown in FIG. 5B having a highly accurate wire pattern 12. Since a green ceramic laminate 111 substantially shrinks only in the thickness direction, the dimensional accuracy in the plane direction can be maintained, the flatness can also be ensured, and in addition, the height of the ceramic electronic component 10 can also be effectively decreased. Since an organic vehicle burns away due to this firing, the shrinkage restriction ceramic green sheets 100 and 100A are formed into aggregates of an alumina powder. The alumina-powder aggregate can be easily removed by a blast treatment, and by removing the alumina powder, the ceramic laminate 11 can be easily obtained.

When a Ag-based conductive paste is used as a wire material, the green composite laminate 110 is fired at approximately 850° C. in air, and when a Cu-based conductive paste is used, the green composite laminate 110 is fired, for example, at approximately 950° C. in a nitrogen gas atmosphere. After the ceramic laminate 11 is obtained, whenever necessary, a film of Ni/Sn, Ni/Au, or the like is formed on the surfaces of the first and the second terminal electrodes 13 and 14 exposed on the top and the bottom surfaces of the ceramic laminate 11 by wet plating or the like. By the sequential steps described above, the ceramic laminate 11 shown in FIG. 5B is obtained.

According to this preferred embodiment as described above, there are provided the ceramic laminate 11 formed of the laminated ceramic layers 11A, the first terminal electrodes 13 disposed in the peripheral portion of the bottom surface of the ceramic laminate 11, the catch pad electrodes 15A arranged in the ceramic laminate 11 so as to face the respective terminal electrodes 13, and the sets each including the two first via hole conductors 16A and 16B, which electrically connect the first terminal electrodes 13 and the respective catch pad electrodes 15A. As a result, even when the first terminal electrodes 13 are formed with a higher density due to the increase in number of functions and the improvement in performance of the ceramic electronic component 10, the first terminal electrodes 13 are tightly bonded to the bottom surface of the ceramic laminate 11 by the anchor effects and the like of the sets each including the two first via hole conductors 16A and 16B and the catch pad electrodes 15A, which are provided in the ceramic laminate 11, and as a result, a high drop resistance strength can be obtained. Accordingly, since the ceramic electronic component 10 can be tightly bonded to the mounting board 40 such as a mother board, even when the mounting board 40 falls or the like, the ceramic electronic component 10 can be prevented from being separated therefrom, and cracks are not generated between the ceramic laminate 11 and the first terminal electrodes 13.

In addition, according to this preferred embodiment, since the ceramic laminate is formed by a non-shrinkage process, and the first terminal electrode 13, the catch pad electrode 15A and the first via hole conductors 16A and 16B are formed of a conductive material primarily composed of Ag, the surface of the ceramic laminate 11 has no irregularities and is flat, and hence a shear stress concentrated at the boundary between the first terminal electrode 13 and the ceramic laminate 11 can be reduced. In addition, when the first terminal electrode 13 is viewed from a catch pad electrode 15A side, the catch pad electrode 15A and the first terminal electrode 13 have parts which are not overlapped with each other, and the area of the catch pad electrode 15A is larger than that of the first terminal electrode 13. As a result, the tensile force can be dispersed by the catch pad electrode 15A, and the drop resistance strength can be further improved.

Furthermore, since the catch pad electrode 15A is electrically connected to another catch pad electrode 15B provided in the ceramic laminate 11 via the second via hole conductor 12C, and the second via hole conductor 12C is disposed parallel to the extension lines of the two first via hole conductors 16A and 16B and is provided therebetween, wire breakage of the second via hole conductor 12C from the catch pad electrode 15A can be reliably prevented. In addition, since the second via conductor 12C is laid across the two first via hole conductors 16A and 16B so as to include the extension lines thereof as shown in FIG. 3D, the bonding strength between the second via hole conductor 12C and the catch pad electrode 15A can be improved.

In addition, since a virtual line between the two first via hole conductors 16A and 16B for one first terminal electrode 13 is arranged in a zigzag configuration in the peripheral portion of the bottom surface of the ceramic laminate 11 so as not to be the same as that between other two first via hole conductors 16A and 16B for another first terminal electrode 13 adjacent to the one first terminal electrode 13, the shear stress, which is caused by a side slip generated, for example, when the ceramic electronic component 10 falls or the like, is reduced by the two first via hole conductors 16A and 16B, the side slip is suppressed, and as a result, the drop resistance strength can be improved. In addition, since the virtual line between the two first via hole conductors 16A and 16B is arranged to pass approximately the center of the bottom surface of the ceramic laminate 11, the shear stress caused by the side slip generated, for example, when the ceramic electronic component 10 falls is transmitted to the central portion of the ceramic laminate 11, the side slip is suppressed, and as a result, the drop resistance strength can be improved.

Second Preferred Embodiment

Figure 6A:
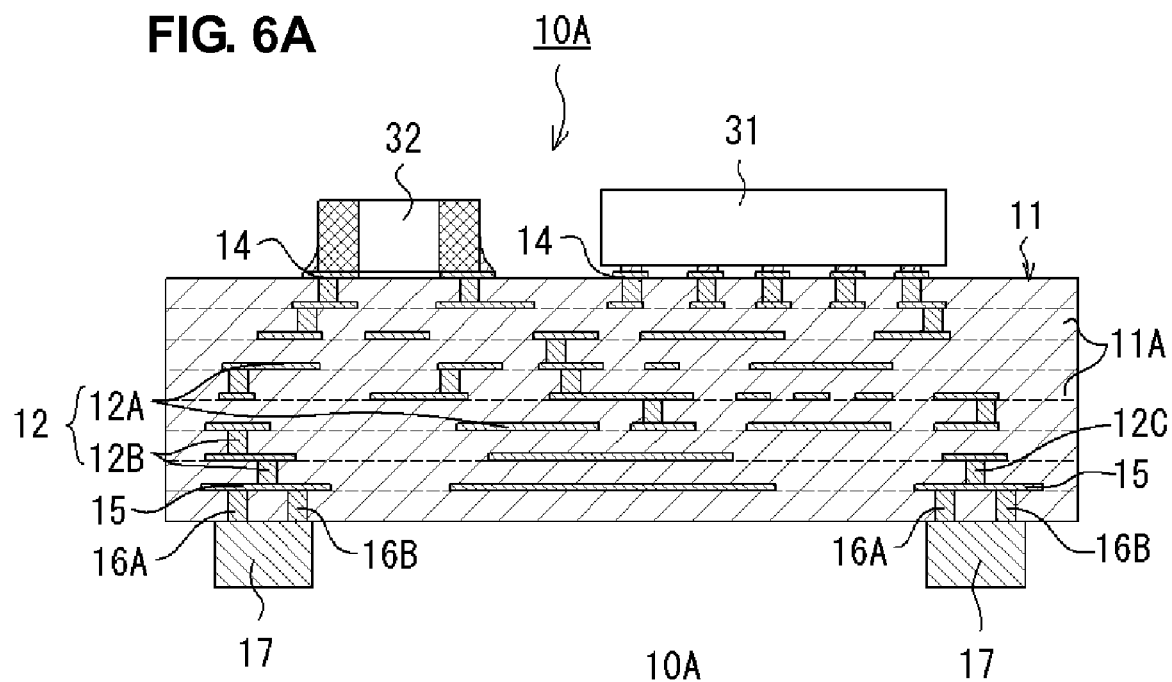
FIGS. 6A to 6C are views showing still another preferred embodiment of the ceramic electronic component according to the present invention, FIG. 6A being a cross-sectional view thereof, FIG. 6B being a perspective view showing a surface to be bonded to a mounting substrate, which is placed at an upper side in the figure, and FIG. 6C being a cross-sectional view of an important portion.
Figure 6B:
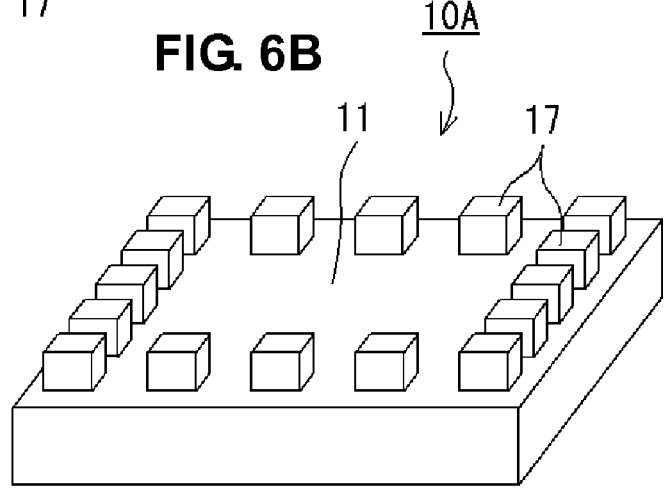
Figure 6C:
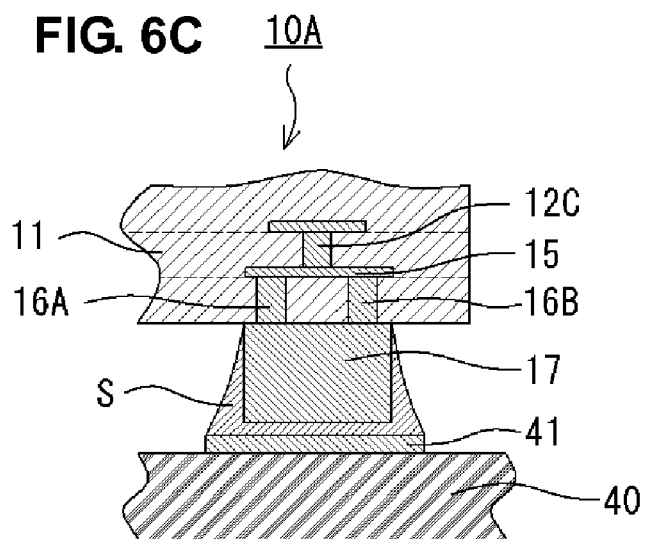

A ceramic electronic component 10A of this preferred embodiment preferably has substantially the same structure as that of the first preferred embodiment except that instead of the first terminal electrodes 13 of the first preferred embodiment, pillar-shaped stud electrodes 17 protruding from the bottom surface of the ceramic laminate 11 are provided, for example, as shown in FIGS. 6A to 6C. That is, the terminal electrodes of the ceramic electronic component of the present invention may be the stud electrodes in this preferred embodiment. The stud electrodes 17 are formed in the peripheral portion of the bottom surface of the ceramic laminate 11 with predetermined intervals as shown in FIG. 6B, and as shown in FIG. 6C, a bonding member S, such as solder, covers the bottom surface and the entire side surfaces of the stud electrode 17 as shown in FIG. 6C, so that the stud electrode 17 is tightly bonded to the terminal electrode 41 of the mounting substrate 40. The height of the stud electrode 17 is preferably in the range of about 25 μm to about 1,000 μm, for example. Incidentally, the same reference numeral designates the same as or corresponding to the constituent of the first preferred embodiment, and the description thereof will be omitted.

Figure 7A:
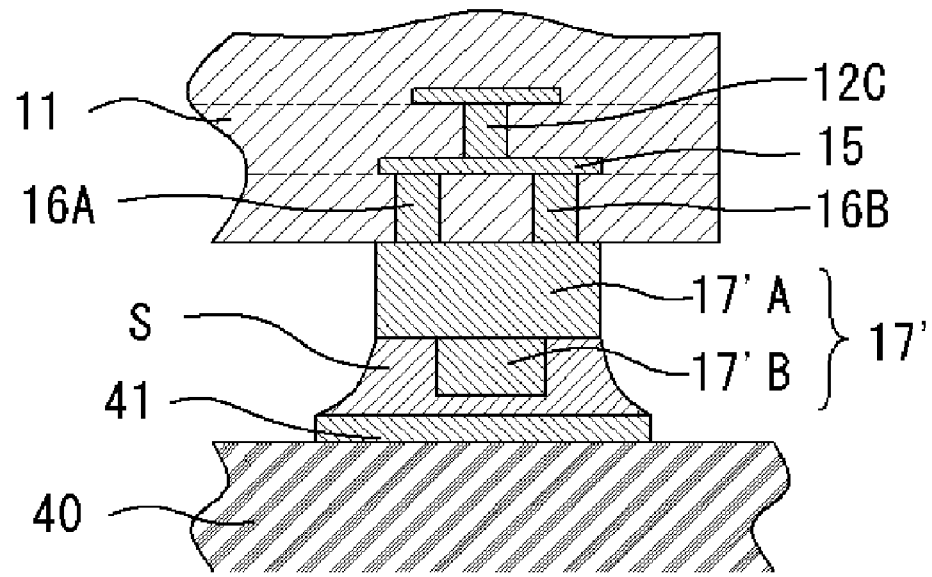
FIGS. 7A and 7B are cross-sectional views each showing an important portion of still another preferred embodiment of the ceramic electronic component according to the present invention.
Figure 7B:
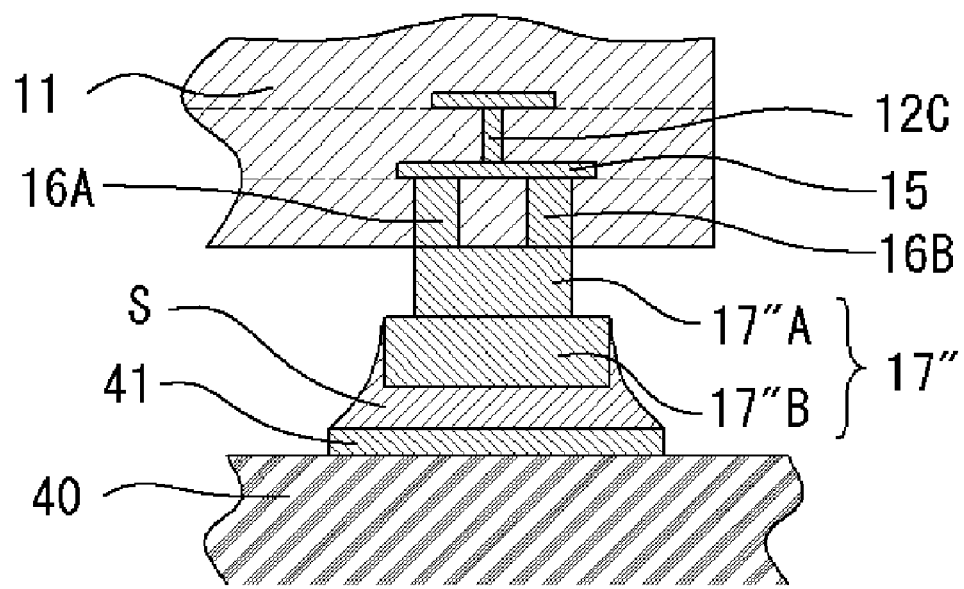

In addition, instead of the stud electrodes 17 shown in FIGS. 6A-6C, a stud electrode 17' or 17" shown in FIG. 7A or 7B, respectively, may be provided. The stud electrode 17' shown in FIG. 7A is formed of a first stud electrode portion 17'A connected to the first via hole conductors 16A and 16B and a second stud electrode portion 17'B having an area smaller than that of the first stud electrode portion 17'A in the horizontal direction. In addition, the first and the second stud electrodes 17'A and 17'B have the same axis core in the up and down direction. In addition, the stud electrode 17" shown in FIG. 7B is formed of a first stud electrode 17"A connected to the first via hole conductors 16A and 16B and a second stud electrode portion 17"B larger than the first stud electrode 17"A, the sizes of the stud electrode portions being opposite to those of the case shown in FIG. 7A. Even when the stud electrodes 17' or 17" are formed to have a two-stage structure in the up and down direction, an effect similar to that of the stud electrode 17 shown in FIGS. 6A-6C can be expected.

When the ceramic electronic component 10A shown in FIGS. 6A-6C is formed, except that the stud electrodes 17 are formed in the restriction ceramic green sheets 100 as shown in FIGS. 8A, 8B, 9A and 9B, the ceramic electronic component 10A can be formed in the manner substantially the same as that in the first preferred embodiment.

Figure 8A:
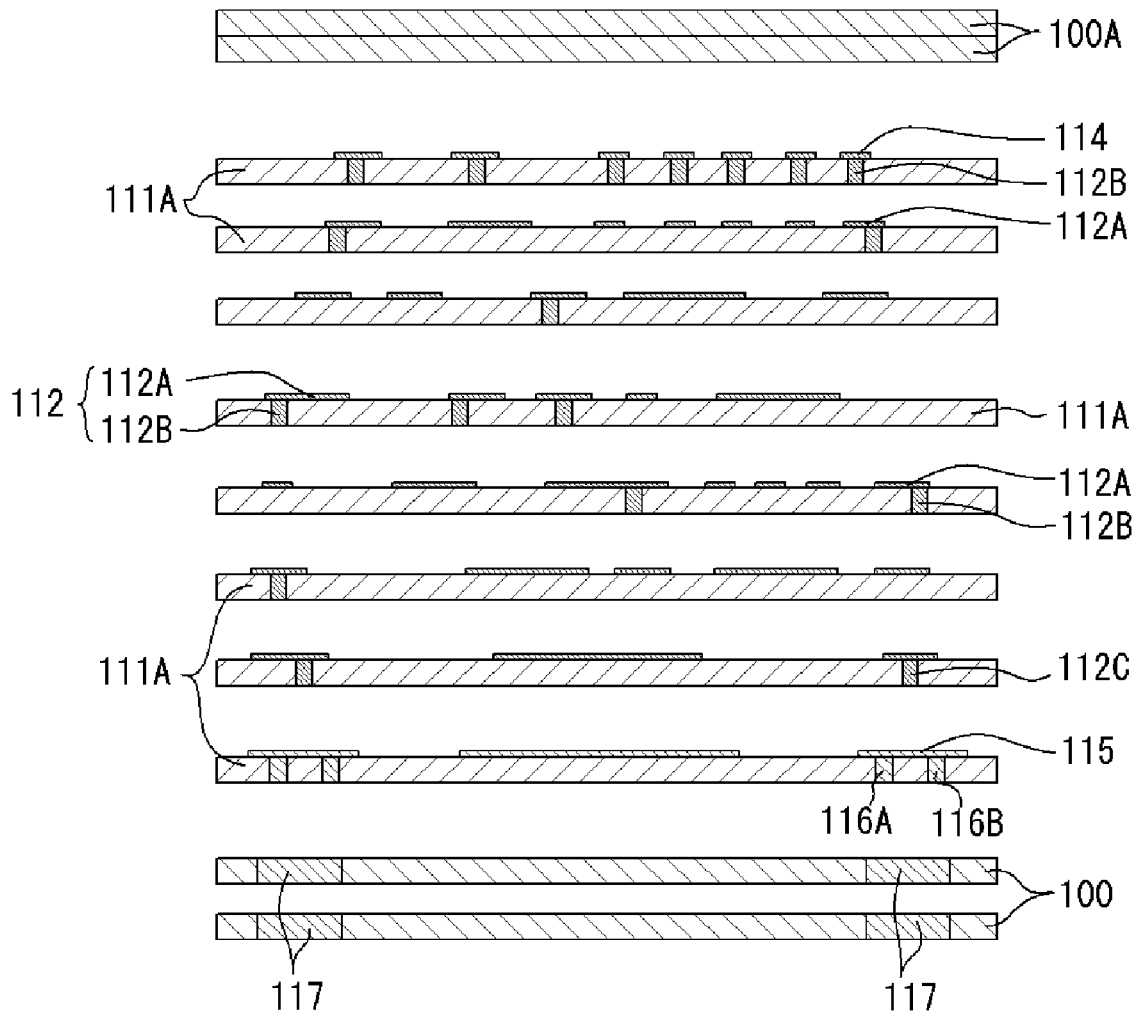
FIGS. 8A and 8B are views each showing a step of manufacturing the ceramic electronic component shown in FIGS. 6A-6C, FIG. 8A being a cross-sectional view showing the order of lamination of ceramic green sheets and restriction ceramic green sheets, and FIG. 8B being a cross-sectional view of a green composite laminate.
Figure 8B:
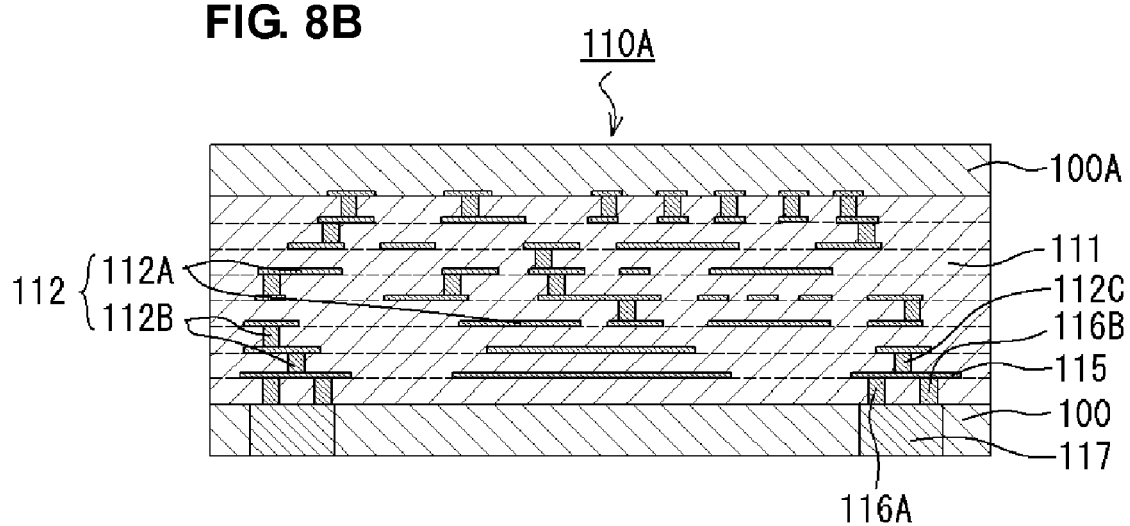

That is, as shown in FIG. 8A, after the ceramic green sheets 111A are formed in the same manner as that in the first preferred embodiment, the line conductive portions 112A and the via hole conductor portions 112B and 112C are formed for predetermined ceramic green sheets 11A. In addition, the first via hole conductor portions 116A and 116B and the catch pad electrode portions 115A are formed for the bottommost ceramic green sheet 111A, and the via hole conductor portions 112B and the terminal electrode portions 114 are formed for the topmost ceramic green sheet 111A. After holes for the stud electrodes 17 having a predetermined pattern are formed in the two restriction ceramic green sheets 100 by using a mold or laser light, a conductive paste is filled in the above holes, so that stud electrode portions 117 are formed.

Figure 9A:
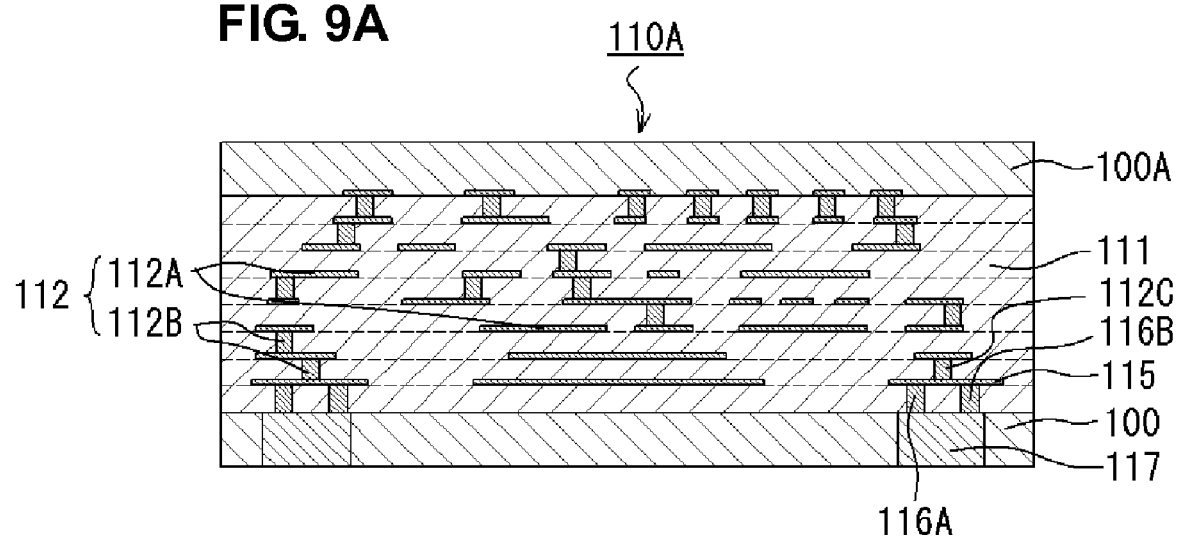
FIGS. 9A and 9B are cross-sectional views showing steps of manufacturing the ceramic electronic component shown in FIGS. 6A-6C before and after firing, respectively.
Figure 9B:
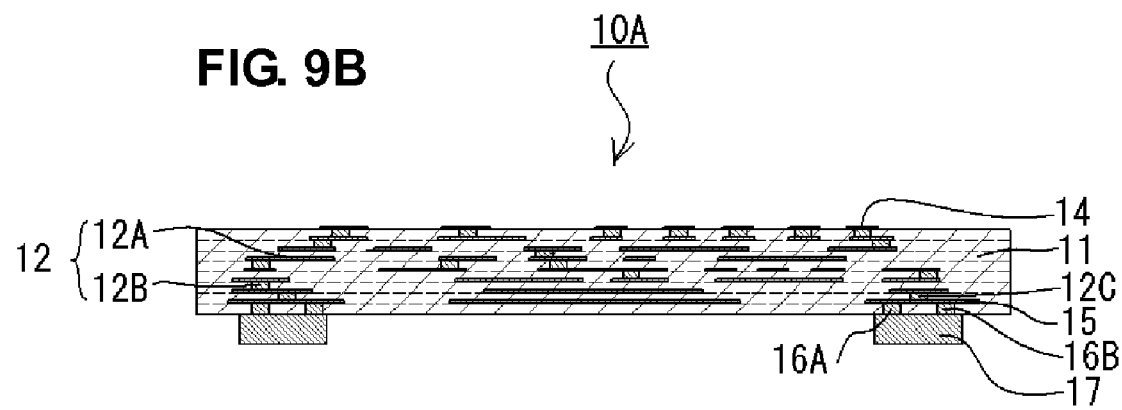

Subsequently, as shown in FIG. 8A, after the two restriction ceramic green sheets 100 having the stud electrode portions 117 are laminated to each other, the predetermined ceramic green sheets 111A are sequentially laminated thereon in the same manner as that in the first preferred embodiment, and in addition, the two restriction ceramic green sheets 100A having no stud electrode portions are then laminated. Next, the sheets thus laminated as described above are integrated by pressure-bonding at a pressure of about 0.2 MPa to about 1.5 MPa in the up and down direction, so that a green composite laminate 110A shown in FIG. 8B can be formed. When the green composite laminate 110A shown in FIG. 9A is fired at a predetermined temperature, the ceramic laminate 11 shown in FIG. 9B can be obtained.

When the stud electrode 17' or 17" shown in FIG. 7A or 7B, respectively, is formed, holes having different sizes (cross-sectional areas in the horizontal direction) are formed in the upper and the lower restriction ceramic green sheets 100, so that the two-stage stud electrode 17' or 17" having different diameters can be obtained.

Figure 10:
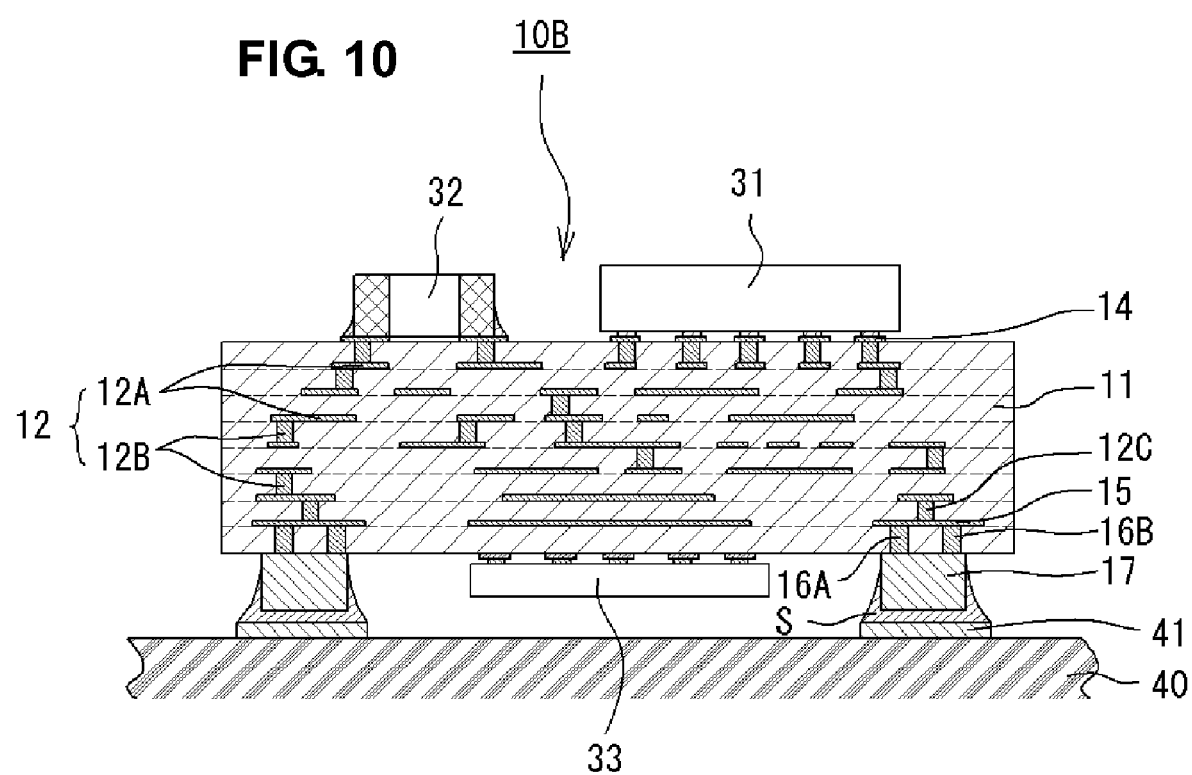
FIG. 10 is a cross-sectional view showing still another preferred embodiment of the ceramic electronic component according to the present invention.

Since the ceramic electronic component 10A has the pillar-shaped stud electrodes 17 in the peripheral portion of the bottom surface of the ceramic laminate 11, a third surface mount component 33 can be mounted on the bottom surface of the ceramic laminate between the stud electrodes 17 as shown in FIG. 10, and hence the increase in number of functions and the improvement in performance of the ceramic electronic component 10A can be facilitated.

According to this preferred embodiment, the ceramic electronic component 10A can be more tightly bonded to the mounting substrate 40, and in addition, an effect similar to that of the first preferred embodiment can also be expected.

Hereinafter, various properties of the ceramic electronic component according to preferred embodiments of the present invention will be described with reference to particular examples.

Example 1

Figure 11:
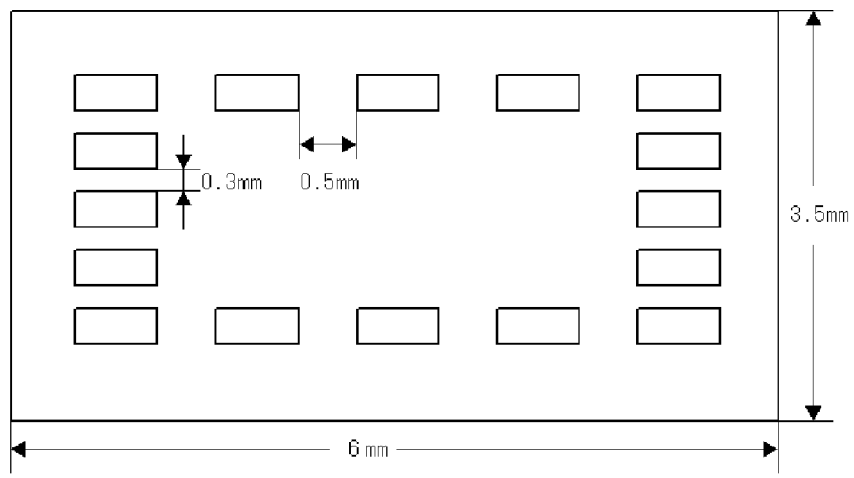
FIG. 11 is a view illustrating an arrangement state of first terminal electrodes of a ceramic electronic component according to Example 1.

In this example, the relationship between the area of the catch pad electrode and the drop resistance strength was investigated. That is, in this example, three types of ceramic electronic components of Examples 1-1 to 1-3 were formed in which only the size of the catch pad electrode was changed. In this case, the restriction ceramic green sheets were formed using $Al_2O_3$, the ceramic green sheets were formed using a low temperature co-fired ceramic material (ceramic material containing $Al_2O_3$ as filler and borosilicate glass (Ca—Al—Si—B—O-based glass) as a sintering auxiliary agent which used an alkaline earth metal oxide as a modified oxide), and in addition, a wire pattern portion and terminal electrode portions were formed using a conductive paste primarily composed of Ag as a wire material. Subsequently, after the green composite laminate was formed using the ceramic green sheets and the restriction ceramic green sheets and was then fired at 870° C., the restriction ceramic green sheets were removed, so that the ceramic electronic components of Examples 1-1 to 1-3 having the following dimensions were formed. The first terminal electrodes of Examples 1-1 to 1-3 were disposed as shown in FIG. 11, and the three types of catch pad electrodes having different sizes were formed inside the ceramic laminate at a distance of 50 μm from the first terminal electrodes. As the conductive paste, a paste was used containing 90% of Ag, 10% of organic components, such as a resin and a solvent, and no glass component.

Dimensions of Ceramic Electronic Component
1. Ceramic substrate: 6.00 mm×3.50 mm×0.50 mm
2. First terminal electrode: 0.4 mm×0.6 mm×0.010 mm
3. Diameter of first via hole conductor: 0.15 mm
   Distance from the center of first terminal electrode in the longitudinal direction: ±0.20 mm
4. Diameter of second via hole conductor: 0.20 mm
5. Dimensions of catch pad electrode Example 1-1

0.30 mm×0.50 mm×0.01 mm

Example 1-2

0.40 mm×0.60 mm×0.01 mm

Example 1-3

0.60 mm×0.80 mm×0.01 mm

In addition, as Comparative Example 1, a ceramic electronic component having the same structure as that in Example 1 was formed except for the electrode structure in which one via hole conductor having a diameter of 0.2 mm was connected to the center of the first terminal electrode of Example 1-2 and the catch pad electrode was omitted.

As Comparative Example 2, a ceramic electronic component was formed in a manner similar to that of Comparative Example 1 except that in order to improve the strength of the via hole conductor, a conductive paste was used containing a glass component similar to that of the low temperature co-fired ceramic material. Since the glass component was contained, the content of Ag was decreased, and hence the resistivity was increased by about 10%.

In addition, as Comparative Example 3, a ceramic electronic component having the same structure as that of Example 1-2 was formed except for the electrode structure in which the catch pad electrode and the first terminal electrode are connected to each other by one via hole conductor disposed at the center of the first terminal electrode.

Next, after 10 ceramic electronic components of each of Examples 1-1 to 1-3 and Comparative Examples 1 to 3 were bonded per one mounting substrate by a solder reflow treatment, a drop test was performed in which the mounting substrates thus prepared were dropped at a height of 1.2 m, 1.5 m, and 1.8 m. For this drop test, 10 mounting substrates were used at each height, 100 ceramic electronic components were evaluated by this drop test, and the results are shown in Table 1. In the results of the drop test, ceramic electronic components in which a crack was generated in the ceramic laminate, in which the via hole conductor or the via hole conductor fell off from the ceramic laminate, and in which the ceramic electronic component was separated from the mounting substrate were regarded as defects, and the number of the defects are shown in Table 1.

TABLE 1

|  | Drop test height | | |
| --- | --- | --- | --- |
|  | 1.2 m | 1.5 m | 1.8 m |
| Example 1-1 | 2 | 6 | 10 |
| Catch pad electrode (0.30 × 0.50 × 0.010) | | | |
| Example 1-2 | 1 | 5 | 8 |
| Catch pad electrode (0.40 × 0.60 × 0.010) | | | |
| Example 1-3 | 0 | 5 | 6 |
| Catch pad electrode (0.60 × 0.80 × 0.010) | | | |
| Comparative Example 1 | 34 | 62 | 79 |
| Comparative Example 2 (using paste containing glass) | 13 | 30 | 62 |
| Comparative Example 3 | 4 | 18 | 51 |

According to the results shown in Table 1, the drop resistance strengths of Examples 1-1 to 1-3 having the electrode structure in which the first terminal electrode and the catch pad electrode were connected by the two via hole conductors were all significantly high as compared to that of Comparative Example 1 having no catch pad electrode and were also significantly high as compared to that of Comparative Example 3 in which the first terminal electrode and the catch pad electrode were connected by one via hole conductor. In addition, as apparent when the results of Examples 1-1 to 1-3 were compared with that of Comparative Example 3, when the first terminal electrode and the catch pad electrode were connected by the two via hole conductors, the drop resistance strength was significantly improved. Furthermore, even when the mechanical strengths of the first terminal electrode and the via hole conductor were improved by addition of the glass component as was the case of Comparative Example 2, the drop resistance strength thereof was seriously decreased as compared to that of Examples 1-1 to 1-3.

In addition, among Examples 1-1 to 1-3, in Example 1-2 in which the area of the catch pad electrode and the area of the first terminal electrode were equal to each other, the drop resistance strength is higher than that in Example 1-1 in which the area of the catch pad electrode was smaller than the area of the first terminal electrode and was lower than that in Example 1-3 in which the area of the catch pad electrode was larger than the area of the first terminal electrode. Hence, it was found that as the area of the catch pad electrode became larger than that of the first terminal electrode, the drop resistance strength was preferably increased.

Example 2

In this example, the relationship between the thickness of the catch pad electrode and the drop resistance strength was investigated. That is, after a ceramic electronic component having the same structure as that of Example 1-2 was formed except that the thickness of the catch pad electrode was set to 0.025 mm which was 2.5 times that of the catch pad electrode (0.40 mm×0.60 mm×0.010 mm) of Example 1-2, the same drop test as that in Example 1 was performed for this ceramic electronic component, and the results are shown in Table 2. In Table 2, a ceramic electronic component of Comparative Example 1 was the same as that of Comparative Example 1 shown in Table 1.

TABLE 2

|  | Drop test height | | |
| --- | --- | --- | --- |
|  | 1.2 m | 1.5 m | 1.8 m |
| Example 2 | 2 | 5 | 7 |
| Catch pad electrode (0.40 × 0.60 × 0.025) | | | |
| Comparative Example 1 | 34 | 62 | 79 |

According to the results shown in Table 2, the ceramic electronic component of this example had a significantly high drop resistance strength as compared to that of the ceramic electronic component of Comparative Example 1, and the results similar to those of Example 1 could be obtained. That is, it was found that although the thickness of the catch pad electrode varied to a certain extent, the drop resistance strength similar to that in Example 1 could be obtained and was hardly influenced thereby.

Example 3

In this example, the relationship between the displacement of the catch pad electrode and the drop resistance strength was investigated. That is, after a ceramic electronic component having the same structure as that of Example 1-2 was formed except that the catch pad electrode of Example 1-2 was moved parallel to one side in the longitudinal direction by 0.10 mm, the same drop test as that in Example 1 was performed for this ceramic electronic component, and the results are shown in Table 3. In Table 3, a ceramic electronic component of Comparative Example 1 was the same as that of Comparative Example 1 shown in Table 1.

TABLE 3

|  | Drop test height | | |
| --- | --- | --- | --- |
|  | 1.2 m | 1.5 m | 1.8 m |
| Example 3 | 1 | 5 | 9 |
| Catch pad electrode being moved parallel to one side in the longitudinal direction by 0.10 mm | | | |
| Comparative Example 1 | 34 | 62 | 79 |

According to the results shown in Table 3, the ceramic electronic component of this example had a significantly high drop resistance strength as compared to that of the ceramic electronic component of Comparative Example 1, and the results similar to those of Example 1 could be obtained. That is, it was found that although the catch pad electrode was moved parallel in the lateral direction to a certain extent, the drop resistance strength similar to that in Example 1 could be obtained and was hardly influenced thereby.

Example 4

In this example, the relationship between the displacement of the first via hole conductor electrode and the drop resistance strength was investigated. That is, after a ceramic electronic component having the same structure as that of Example 1-2 was formed except that one of the first via hole conductors of Example 1-2 was moved parallel to the outside in the longitudinal direction by 0.10 mm, the same drop test as that in Example 1 was performed for this ceramic electronic component, and the results are shown in Table 4. In Table 4, a ceramic electronic component of Comparative Example 1 was the same as that of Comparative Example 1 shown in Table 1.

TABLE 4

|  | Drop test height | | |
|---|---|---|---|
|  | 1.2 m | 1.5 m | 1.8 m |
| Example 4 One via hole electrode being moved parallel to outside in the longitudinal direction by 0.10 mm | 2 | 6 | 8 |
| Comparative Example 1 | 34 | 62 | 79 |

According to the results shown in Table 4, the ceramic electronic component of this example had a significantly high drop resistance strength as compared to that of the ceramic electronic component of Comparative Example 1, and the results similar to those of Example 1 could be obtained. That is, it was found that although the first via hole conductor was moved parallel in the lateral direction to a certain extent, the drop resistance strength similar to that in Example 1 could be obtained and was hardly influenced thereby.

Example 5

In this example, the relationship between the thickness of the first terminal electrode and the drop resistance strength was investigated. That is, after a ceramic electronic component having the same structure as that of Example 1-2 was formed except that instead of the first terminal electrode of Example 1-2, a stud electrode (0.40 mm×0.60 mm×0.10 mm) having a thickness 10 times that of the first terminal electrode was provided, the same drop test as that in Example 1 was performed for this ceramic electronic component, and the results are shown in Table 5. In Table 5, a ceramic electronic component of Comparative Example 1 was the same as that of Comparative Example 1 shown in Table 1.

TABLE 5

|  | Drop test height | | |
|---|---|---|---|
|  | 1.2 m | 1.5 m | 1.8 m |
| Example 5 Stud electrode being provided instead of first terminal electrode | 0 | 2 | 4 |
| Comparative Example 1 | 34 | 62 | 79 |

According to the results shown in Table 5, the ceramic electronic component of this example had a significantly high drop resistance strength as compared to that of the ceramic electronic component of Comparative Example 1 and also had a higher drop resistance strength than that of Example 1-2. That is, it was found that when the stud electrode was provided, the bonding strength with the mounting substrate was further improved.

Example 6

In this example, the drop resistance strength was investigated when catch pad electrodes were separately connected to the first via hole conductors. That is, after a ceramic electronic component having the same structure as that of Example 1-2 was formed except that instead of the catch pad electrode of Example 1-2, two catch pad electrodes (0.40 mm×0.20 mm×0.010 mm) were provided and were separately connected to the first terminal electrode via the respective first via hole conductors, and a second via hole conductor of a wire pattern was connected to only one of the catch pad electrodes, the same drop test as that in Example 1 was performed for this ceramic electronic component, and the results are shown in Table 6. In Table 6, a ceramic electronic component of Comparative Example 1 was the same as that of Comparative Example 1 shown in Table 1.

TABLE 6

|  | Drop test height | | |
|---|---|---|---|
|  | 1.2 m | 1.5 m | 1.8 m |
| Example 6 Catch pad electrodes being provided for respective via hole electrodes | 3 | 8 | 12 |
| Comparative Example 1 | 34 | 62 | 79 |

According to the results shown in Table 6, the ceramic electronic component of this example had a significantly high drop resistance strength as compared to that of the ceramic electronic component of Comparative Example 1; however, the drop resistance strength was decreased lower than that of any of the ceramic electronic components of Example 1. That is, it was found that when the catch pad electrode and the first terminal electrode were connected to each other by at least two first via hole conductors, the catch pad electrode was not preferably divided in accordance with the number of the first via hole conductors.

Example 7

In this example, the relationship between the drop resistance strength and the arrangement of the first via hole conductors was investigated. That is, the arrangement of the first via hole conductors of Example 1-2 shown in FIG. 2A was changed to that shown in FIG. 2B. That is, after a ceramic electronic component having the same structure as that of Example 1-2 was formed except that the first via hole conductors of this example were approximately disposed radially through the center of the ceramic laminate, the same drop test as that in Example 1 was performed for this ceramic electronic component, and the results are shown in Table 7. In Table 7, a ceramic electronic component of Comparative Example 1 was the same as that of Comparative Example 1 shown in Table 1.

TABLE 7

|  | Drop test height | | |
|---|---|---|---|
|  | 1.2 m | 1.5 m | 1.8 m |
| Example 7 Via hole electrodes being radially disposed | 0 | 4 | 5 |
| Comparative Example 1 | 34 | 62 | 79 |

According to the results shown in Table 7, the ceramic electronic component of this example had a significantly high drop resistance strength as compared to that of the ceramic electronic component of Comparative Example 1, and the drop resistance strength was higher than that of Example 1-2. That is, it was found that when the via hole conductors were disposed radially through the center of the ceramic laminate, the tensile force, the shear stress, and the like could be effectively reduced, and a strength against the tension and/or the side slip was increased.

Example 8

Figure 12:
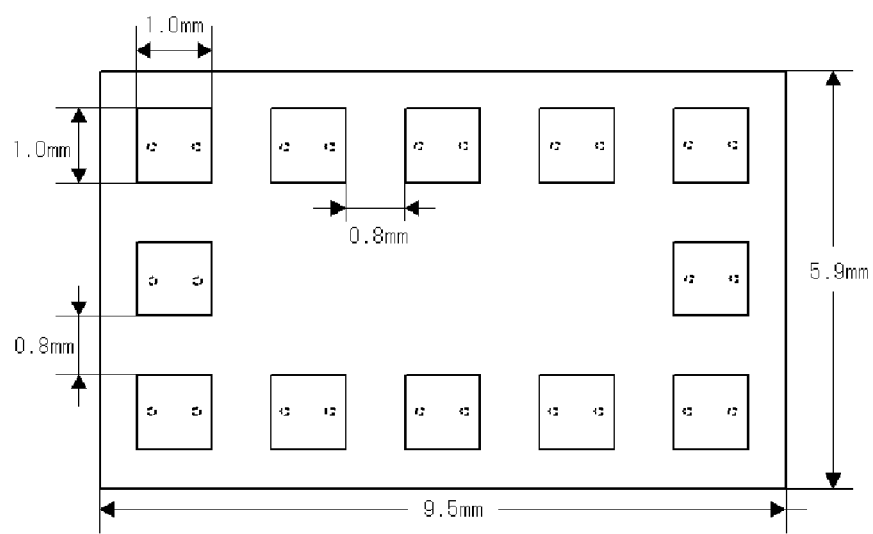
FIG. 12 is a view illustrating an arrangement state of first terminal electrodes and first via hole conductors of a ceramic electronic component according to Example 8.

In this example, the relationship between the drop resistance strength and the area ratio of the first via hole conductor to the first terminal electrode (=cross-sectional area of the first via hole electrode/area of the first terminal electrode) was investigated. That is, a ceramic electronic component having the same structure as that of Example 1 was formed except that as shown in FIG. 12, a ceramic laminate of 5.9 mm×9.5 mm was formed, a first electron electrode of 1.00 mm×1.00 mm×0.010 mm were provided in the peripheral portion thereof, catch pad electrodes having the same size as that of the first terminal electrodes were also provided, and the first terminal electrode and the corresponding catch pad electrode were connected to each other by two via hole conductors each having a diameter of 0.10 mm. Subsequently, the same drop test as that in Example 1 was performed for this ceramic electronic component, and the results are shown in Table 8.

In addition, as Comparative Example 4, a ceramic electronic component was formed in which the same first terminal electrodes as those of this example were provided, and via hole conductors having a diameter of 0.20 mm were connected to the centers thereof. In the ceramic electronic component of Comparative Example 4, the catch pad electrodes were not provided. For this ceramic electronic component, the same drop test as that of Example 1 was performed, and the results are shown in Table 8.

TABLE 8

|  | Drop test height | | |
| --- | --- | --- | --- |
|  | 1.2 m | 1.5 m | 1.8 m |
| Example 8 | 4 | 11 | 16 |
| Comparative Example 4 | 10 | 26 | 37 |

According to the results shown in Table 8, it was found that when the area ratio (≈0.016) of the first via hole conductor to the first terminal electrode was 0.016 or more, the drop resistance strength was increased, and hence the area ratio was preferably 0.016 or more.

Example 9

In this example, the relationship between the drop resistance strength and the area of the first terminal electrode was investigated. That is, a ceramic electronic component having the same structure as that of Example 8 was formed except that instead of the first terminal electrodes (1.00 mm×1.00 mm×0.010 mm) and the catch pad electrodes having the same size as that thereof, first terminal electrodes of 1.50 mm×1.50 mm×0.010 mm and catch pad electrodes having the same size as that thereof were provided, and the connection therebetween was performed by two via hole conductors having a diameter of 0.20 mm. Subsequently, the same drop test as that in Example 1 was performed for this ceramic electronic component, and the results are shown in Table 9.

In addition, as Comparative Example 5, a ceramic electronic component having the same electrode structure as that of Comparative Example 4 was formed except that the same first terminal electrodes as those of this example were provided. For this ceramic electronic component, the same drop test as that of Example 1 was performed, and the results are shown in Table 9.

TABLE 9

|  | Drop test height | | |
| --- | --- | --- | --- |
|  | 1.2 m | 1.5 m | 1.8 m |
| Example 9 | 4 | 9 | 15 |
| Comparative Example 5 | 4 | 10 | 19 |

According to the results shown in Table 9, it was found that when the area of the first terminal electrode was more than 1.00 mm², the area was excessively large as the terminal electrode, and as a result, the effect of improving the drop resistance strength, which was obtained by connecting the first terminal electrode and the catch pad electrode by the two via hole conductors, tended to be degraded. That is, it was found that the area of the first terminal electrode was preferably 1.00 mm² or less.

Examples 10 to 12

In this example, the relationship between the drop resistance strength and the non-shrinkage process and the relationship between the drop resistance strength and the wire material were investigated. That is, in this example, after the same ceramic electronic component as that of Example 1-2 was formed, the same drop test as that in Example 1 was performed, and the results are shown in Table 10.

In addition, as Example 11, a ceramic electronic component having the same structure as that of Example 1-2 was formed by a common firing process (shrinkage process) in which the restriction ceramic green sheets were not used. Furthermore, as Example 12, a ceramic electronic component having the same electrode structure as that of Example 1-2 was formed by a non-shrinkage process using a conductive paste primarily composed of Cu as a wire material. For the non-shrinkage process performed in Example 12, the same ceramic green sheets and the same restriction ceramic green sheets as those of Example 1 were formed. In addition, after predetermined ceramic green sheets were sequentially laminated on one restriction ceramic green sheet, and another restriction ceramic green sheet and the topmost ceramic green sheet were further laminated thereon, this composite laminate was fired at 870° C., so that a ceramic electronic component having the same structure as that of Example 1-2 was formed. In the case described above, during the firing of the composite laminate, the glass component of the topmost ceramic green sheet flowed into the restriction ceramic green sheet located thereunder and then solidified, this restriction ceramic green sheet was sintered and suppressed the shrinkage, and the shrinkage was suppressed by the bottommost restriction ceramic green sheet. After the firing, AlO of the bottommost layer was removed. For the ceramic electronic components of Examples 11 and 12, the same drop test as that of Example 1 was performed, and the results are shown in Table 10.

Figure 13A:
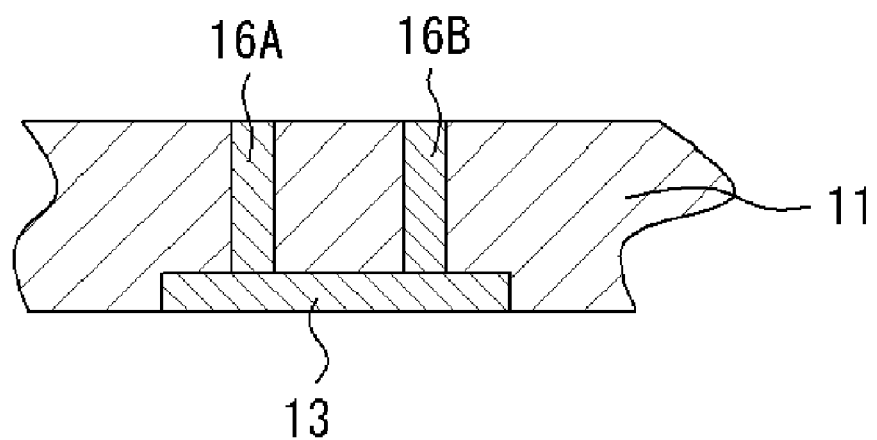
FIGS. 13A and 13B are cross-sectional views illustrating important portions of ceramic electronic components formed by a non-shrinkage process and a shrinkage process, respectively, in Example 10.
Figure 13B:
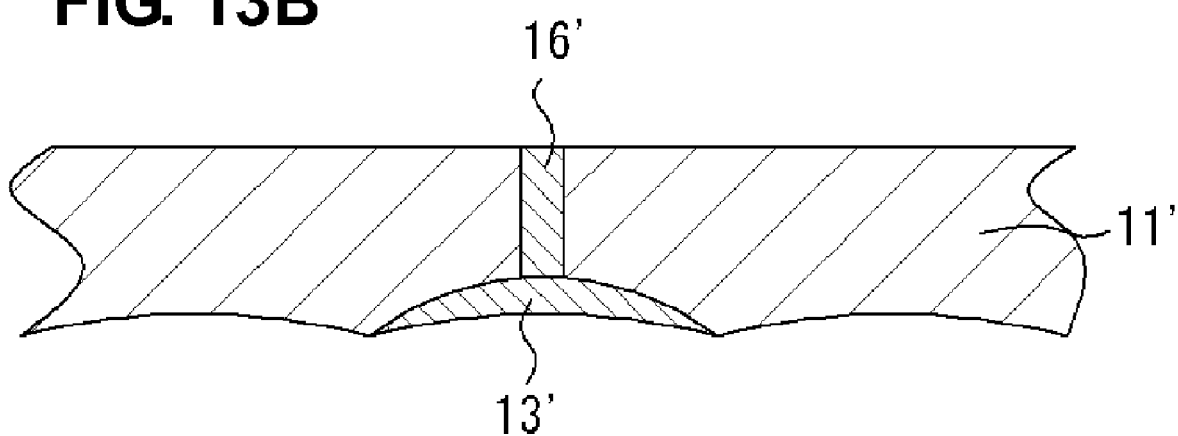

Although a flat ceramic electronic component as shown in FIG. 13A was obtained in Examples 10 and 12, in Example 11 using the shrinkage process, a ceramic electronic component having irregularities on the surfaces of a terminal electrode 13' and a ceramic laminate 11' was obtained as shown in FIG. 13B.

TABLE 10

| | Drop test height | | |
| --- | --- | --- | --- |
| | 1.2 m | 1.5 m | 1.8 m |
| Example 10 (the same ceramic electronic component as that in Example 1-2) | 1 | 5 | 8 |
| Example 11 (ceramic electronic component by shrinkage process) | 21 | 48 | 66 |
| Example 12 (ceramic electronic component using Cu as wire material) | 18 | 42 | 57 |

According to the results shown in Table 10, it was found that in the case of the ceramic electronic component of Example 11 formed by the shrinkage process, since the irregularities were present on the surface, the durability against a shear force was small, and the drop resistance strength was also slightly inferior. In addition, it was found that in the case of the ceramic electronic component of Example 12 in which Cu was used as a wire material, although the effect of improving the drop resistance strength was observed as compared to that obtained by the shrinkage process, when Cu having a high Young's modulus was used as a wire material, an effect of reducing the compressive stress was small, and the increase in drop resistance strength was limited at a certain level.

Incidentally, it is to be understood that the present invention is not limited to the above examples and preferred embodiments.

The present invention can be preferably applied to ceramic electronic components mounted on mobile terminals and the like.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A ceramic electronic component comprising:
   a ceramic laminate including ceramic layers laminated to each other;
   at least one first terminal electrode provided on a first primary surface of the ceramic laminate to be connected to a mounting surface;
   at least one second terminal electrode provided on a second primary surface of the ceramic laminate opposite to the first primary surface;
   at least one catch pad electrode arranged in the ceramic laminate so as to face the at least one first terminal electrode; and
   at least one set of via hole conductors each including at least two first via hole conductors which are directly connected to the at least one first terminal electrode and to the at least one catch pad electrode; wherein
   no set of via hole conductors including the at least one set of via hole conductors is directly connected to any terminal electrode provided on the second primary surface of the ceramic laminate including the at least one second terminal electrode; and
   no terminal electrode provided on the second primary surface of the ceramic laminate including the at least one second terminal electrode is connected to any catch pad electrode in the ceramic laminate including the at least one catch pad electrode by any set of via hole conductors including the at least one set of via hole conductors; and
   the at least one catch pad electrode is connected to another catch pad electrode via at least one second via hole conductor provided on the at least one catch pad electrode and extending to the another catch pad electrode.

2. The ceramic electronic component according to claim 1, wherein the at least one first terminal electrode is disposed in a peripheral portion of the first primary surface of the ceramic laminate, and the at least one catch pad electrode is arranged so as to face a respective one of the at least one first terminal electrode.

3. The ceramic electronic component according to claim 1, wherein the ceramic laminate is formed by a non-shrinkage process, and the at least one first terminal electrode, the at least one catch pad electrode, and the at least two first via hole conductors are made of a conductive material primarily composed of Ag.

4. The ceramic electronic component according to claim 1, wherein the at least one first terminal electrode and the at least one catch pad electrode include portions which are not overlapped with each other when the at least one first terminal electrode is viewed from a side of the at least one catch pad electrode.

5. The ceramic electronic component according to claim 1, wherein the at least one first terminal electrode is a stud electrode in the form of a pillar protruding from the first primary surface.

6. The ceramic electronic component according to claim 1, wherein the at least one first terminal electrode, the at least two first via hole conductors, and the at least one catch pad electrode are fired and integrated together.

7. The ceramic electronic component according to claim 2, wherein among said at least two first via hole conductors, a virtual line connecting said at least two first via hole conductors for one first terminal electrode is arranged so as not to be the same as a virtual line connecting at least two first via hole conductors of another first terminal electrode adjacent to said one first terminal electrode.

8. The ceramic electronic component according to claim 4, wherein an area of the at least one catch pad electrode is larger than an area of the at least one first terminal electrode.

9. The ceramic electronic component according to claim 7, wherein the virtual line connecting the two first via hole conductors is arranged so as to pass approximately the center of the first primary surface.

10. A ceramic electronic component comprising:
    a ceramic laminate including ceramic layers laminated to each other;
    at least one first terminal electrode provided on a first primary surface of the ceramic laminate to be connected to a mounting surface;
    at least one second terminal electrode provided on a second primary surface of the ceramic laminate opposite to the first primary surface;
    at least two catch pad electrodes arranged in the ceramic laminate so as to face the at least one first terminal electrode; and
    at least one set of via hole conductors each including at least two first via hole conductors which are directly connected to the at least one first terminal electrode; wherein no set of via hole conductors including the at least one set of via hole conductors is directly connected to any terminal electrode provided on the second primary surface of the ceramic laminate including the at least one second terminal electrode;
    no terminal electrode provided on the second primary surface of the ceramic laminate including the at least one second terminal electrode is connected to any catch pad electrode in the ceramic laminate including the at least two catch pad electrodes by any set of via hole conductors including the at least one set of via hole conductors; and the at least two first via hole conductors of the at least one set of via hole conductors are respectively directly connected to the at least two catch pad electrodes;

at least one of the at least two catch pad electrodes is connected to another catch pad electrode via at least one second via hole conductor provided on the at least one of the at least two catch pad electrodes and extending to the another catch pad electrode.

11. The ceramic electronic component according to claim 10, wherein the at least one first terminal electrode is disposed in a peripheral portion of the first primary surface of the ceramic laminate, and the at least two catch pad electrodes are arranged so as to face a respective one of the at least one first terminal electrode.

12. The ceramic electronic component according to claim 10, wherein the ceramic laminate is formed by a non-shrinkage process, and the at least one first terminal electrode, the at least two catch pad electrodes, and the at least two first via hole conductors are made of a conductive material primarily composed of Ag.

13. The ceramic electronic component according to claim 10, wherein the at least one first terminal electrode and the at least two catch pad electrodes include portions which are not overlapped with each other when the at least one first terminal electrode is viewed from a side of the at least one catch pad electrode.

14. The ceramic electronic component according to claim 10, wherein the at least one first terminal electrode is a stud electrode in the form of a pillar protruding from the first primary surface.

15. The ceramic electronic component according to claim 10, wherein the at least one first terminal electrode, the at least two first via hole conductors, and the at least two catch pad electrodes are fired and integrated together.

16. The ceramic electronic component according to claim 11, wherein among said at least two first via hole conductors, a virtual line connecting said at least two first via hole conductors for one first terminal electrode is arranged so as not to be the same as a virtual line connecting at least two first via hole conductors of another first terminal electrode adjacent to said one first terminal electrode.

17. The ceramic electronic component according to claim 16, wherein the virtual line connecting the at least two first via hole conductors is arranged so as to pass approximately the center of the first primary surface.

* * * * *